United States Patent
Finkeldey et al.

(10) Patent No.: US 11,613,497 B2
(45) Date of Patent: Mar. 28, 2023

(54) $Y_2O_3$-CONTAINING GLASS COMPOSITIONS, SUBSTRATES, AND ARTICLES

(71) Applicant: CORNING INCORPORATED, Corning, NY (US)

(72) Inventors: John Philip Finkeldey, Elkland, PA (US); Timothy Michael Gross, Corning, NY (US); Alexandra Lai Ching Kao Andrews Mitchell, Corning, NY (US); Charlene Marie Smith, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 17/095,863

(22) Filed: Nov. 12, 2020

(65) Prior Publication Data

US 2021/0155529 A1 May 27, 2021

Related U.S. Application Data

(60) Provisional application No. 62/941,374, filed on Nov. 27, 2019.

(51) Int. Cl.
*B32B 15/04* (2006.01)
*B32B 17/06* (2006.01)
(Continued)

(52) U.S. Cl.
CPC ............. *C03C 3/097* (2013.01); *C03C 3/091* (2013.01); *C03C 3/095* (2013.01); *C03C 4/18* (2013.01);
(Continued)

(58) Field of Classification Search
CPC .............................. C03C 21/002; C03C 3/095
(Continued)

(56) References Cited

U.S. PATENT DOCUMENTS

| 3,804,646 | A | 4/1974 | Dumbaugh, Jr. |
| 8,854,623 | B2 | 10/2014 | Fontaine et al. |

(Continued)

FOREIGN PATENT DOCUMENTS

| WO | 2019/105250 A1 | 6/2019 |
| WO | WO2019150654 | * 8/2019 |

OTHER PUBLICATIONS

International Search Report and Written Opinion of the International Searching Authority; PCT/US2020/060100; dated Sep. 17, 2021; 10 pages; European Patent Office.

(Continued)

*Primary Examiner* — Lauren R Colgan

(57) ABSTRACT

A glass substrate formed from a glass composition is disclosed. In embodiments, the composition comprises: from 60 mol. % to 75 mol. % $SiO_2$; from 2 mol. % to 15 mol. % $Li_2O$; from 1.9 mol. % to 15 mol. % $Y_2O_3$; and at least one of $B_2O_3$ and $Na_2O$. $B_2O_3+Na_2O$ is from 2 mol. % to 13 mol. %. $Y_2O_3+Al_2O_3$ is from 10 mol. % to 24 mol. %. A ratio $R_2O/Al_2O_3$ is from 0.5 to 4, where $R_2O$ is a total concentration of $Li_2O$, $Na_2O$, $K_2O$, $Rb_2O$, and $Cs_2O$. $(R_2O+RO)/Al_2O_3$ is from 0.5 to 4.5, where RO is a total concentration of BeO, MgO, CaO, SrO, and BaO. The glass substrate has a Young's modulus from 75 gigapascals (GPa) to 110 GPa. The glass substrate is ion exchangeable to form a strengthened glass article.

20 Claims, 4 Drawing Sheets

(51) Int. Cl.
*C03C 3/097* (2006.01)
*C03C 3/095* (2006.01)
*H05K 5/03* (2006.01)
*C03C 21/00* (2006.01)
*C03C 4/18* (2006.01)
*C03C 3/091* (2006.01)

(52) U.S. Cl.
CPC ............. *C03C 21/002* (2013.01); *H05K 5/03* (2013.01); *C03C 2204/00* (2013.01)

(58) Field of Classification Search
USPC .................................................. 428/410, 426
See application file for complete search history.

(56) References Cited

U.S. PATENT DOCUMENTS

| | | | |
|---|---|---|---|
| 9,701,569 B2* | 7/2017 | DeMartino | ....... B32B 17/10018 |
| 2005/0209082 A1 | 9/2005 | Apel et al. | |
| 2009/0023574 A1 | 1/2009 | Holand et al. | |
| 2012/0107647 A1 | 5/2012 | Matsumoto et al. | |
| 2020/0325066 A1* | 10/2020 | Murayama | .............. C03C 3/093 |

OTHER PUBLICATIONS

"Bubsey, R. T et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992),".

"Reddy, K. P. R. et al., "Fracture Toughness Measurement of Glass and Ceramic Materials Using Chevron-Notched Specimens," J. Am. Ceram. Soc., 71 [6], C-310-C-313 (1988)".

X. Zou, H. Toratani, Compositional Design of High Modulus Glasses for Disk Substrates, Journal of Non-Crystalline Solids 290 (2001) 180-188.

* cited by examiner

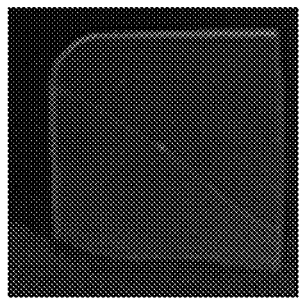
| PARAMETER | 9h, 2% |
|---|---|
| CT, MPa | 106.7 |
| SSE, J/m2 | 27.1 |
| CS, MPa | 865.4 |
| DOL, μm | 8.3 |
FIG. 4A
| PARAMETER | 9h, 2.33% |
|---|---|
| CT, MPa | 115.4 |
| SSE, J/m2 | 31.9 |
| CS, MPa | 850.8 |
| DOL, μm | 8.3 |
FIG. 4B
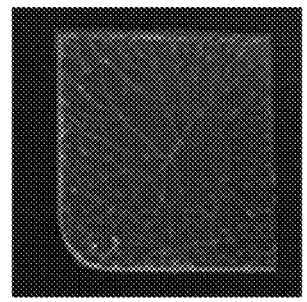
| PARAMETER | 9h, 2.66% |
|---|---|
| CT, MPa | 128.5 |
| SSE, J/m2 | 38.1 |
| CS, MPa | 827.3 |
| DOL, μm | 8.1 |
FIG. 4C
| PARAMETER | 9h, 3% |
|---|---|
| CT, MPa | 137.8 |
| SSE, J/m2 | 45.5 |
| CS, MPa | 810.9 |
| DOL, μm | 8.1 |
FIG. 4D

$Y_2O_3$-CONTAINING GLASS COMPOSITIONS, SUBSTRATES, AND ARTICLES

This application claims the benefit of priority of U.S. Provisional Application Ser. No. 62/941,374 filed on Nov. 27, 2019 the content of which is relied upon and incorporated herein by reference in its entirety.

BACKGROUND

Field

The present specification generally relates to glass substrates exhibiting improved damage resistance and, more particularly, to glass substrates formed from glass compositions comprising $Y_2O_3$ having relatively high Young's moduli and relatively high liquidus viscosities that may be strengthened by ion exchange to form glass articles having relatively high central tensions and relatively high surface compressive stresses.

Technical Background

Glass is used in a variety of products having a high likelihood of sustaining damage, such as in portable electronic devices, touch screens, scanners, sensors, LIDAR equipment, and architectural materials. Glass breakage is common in these applications.

Accordingly, a need exists for alternative glass compositions that can be used to form glass articles that are more resistant to breakage.

SUMMARY

According to a first aspect A1, a glass substrate may be formed from a glass composition comprising: from 60 mol. % to 75 mol. % $SiO_2$; from 2 mol. % to 15 mol. % $Li_2O$; from 1.9 mol. % to 15 mol. % $Y_2O_3$; and at least one of $B_2O_3$ and $Na_2O$. $B_2O_3+Na_2O$ is from 2 mol. % to 13 mol. %. $Y_2O_3+Al_2O_3$ is from 10 mol. % to 24 mol. %. A ratio $R_2O/Al_2O_3$ is from 0.5 to 4, where $R_2O$ is a total concentration of $Li_2O$, $Na_2O$, $K_2O$, $Rb_2O$, and $Cs_2O$. $(R_2O+RO)/Al_2O_3$ is from 0.5 to 4.5, where RO is a total concentration of BeO, MgO, CaO, SrO, and BaO. The glass composition has a Young's modulus from 75 gigapascals (GPa) to 110 GPa. The glass substrate is ion exchangeable to form a strengthened glass article.

A second aspect A2 includes the glass substrate according to the first aspect A1, wherein the glass substrate has a liquidus viscosity from 3 kilopoise (kP) to 50 kP.

A third aspect A3 includes the glass substrate according to any of the foregoing aspects, wherein the glass substrate has a refractive index at 589.3 nm of from 1.5 to 1.6.

A fourth aspect A4 includes the glass substrate according to any of the foregoing aspects, wherein the glass substrate has a fracture toughness of from 0.75 MPa*$\sqrt{m}$ to 0.9 MPa*$\sqrt{m}$.

A fifth aspect A5 includes the glass substrate according to any of the foregoing aspects, wherein the glass substrate is strengthened by ion exchange in a 100% $NaNO_3$ bath at 430° C. for from 2 hours to 4 hours to form a strengthened glass article, and the glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension from 140 MPa to 210 MPa.

A sixth aspect A6 includes the glass substrate according to any of the foregoing aspects, wherein the glass substrate is strengthened by ion exchange in a mixed bath comprising $NaNO_3$ and $KNO_3$ at 430° C. for from 2 to 16 hours to form a strengthened glass article, and the strengthened glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension from 90 MPa to 280 MPa.

A seventh aspect A7 includes the glass substrate according to aspect A6, wherein the mixed bath comprises from 75% to 85% $NaNO_3$ and from 15% to 25% $KNO_3$, and the tensile stress region has a maximum central tension from 150 MPa to 280 MPa.

An eighth aspect A8 includes the glass substrate according to any of the foregoing aspects, wherein $0.8 \leq (R_2O+RO+Y_2O_3)/Al_2O_3 \leq 8$.

A ninth aspect A9 includes the glass substrate according to any of the foregoing aspects, wherein $0.25 \leq Al_2O_3/Y_2O_3 \leq 9$.

A tenth aspect A10 includes the glass substrate according to any of the foregoing aspects, wherein the glass composition comprises from 3.5 mol. % to 22 mol. % $Al_2O_3$.

An eleventh aspect A11 includes the glass substrate according to any of the foregoing aspects, wherein the glass composition comprises from 0 mol. % to 11 mol. % $B_2O_3$, and from 0 mol. % to 13 mol. % $Na_2O$.

A twelfth aspect A12 includes the glass substrate according to any of the foregoing aspects, wherein the glass composition comprises from 2 mol. % to 2.5 mol. % $Na_2O$.

A thirteenth aspect A13 includes the glass substrate according to any of the foregoing aspects, wherein the glass composition comprises from 9 mol. % to 15 mol. % $R_2O$.

A fourteenth aspect A14 includes the glass substrate according to any of the foregoing aspects, wherein the glass composition comprises from 1.5 mol. % to 11 mol. % $B_2O_3$.

A fifteenth aspect A15 includes an electronic device comprising a cover element. The cover element comprises a glass substrate formed from a glass composition comprising: from 60 mol. % to 75 mol. % $SiO_2$; from 2 mol. % to 15 mol. % $Li_2O$; from 1.9 mol. % to 15 mol. % $Y_2O_3$; and at least one of $B_2O_3$ and $Na_2O$. $B_2O_3+Na_2O$ is from 2 mol. % to 13 mol. %. $Y_2O_3+Al_2O_3$ is from 10 mol. % to 24 mol. %. A ratio $R_2O/Al_2O_3$ is from 0.5 to 4, where $R_2O$ is a total concentration of $Li_2O$, $Na_2O$, $K_2O$, $Rb_2O$, and $Cs_2O$. $(R_2O+RO)/Al_2O_3$ is from 0.5 to 4.5, where RO is a total concentration of BeO, MgO, CaO, SrO, and BaO. The glass composition has a Young's modulus from 75 gigapascals (GPa) to 110 GPa. The glass substrate is ion exchangeable to form a strengthened glass article.

A sixteenth aspect A16 includes the electronic device according to the fifteenth aspect A15, wherein the glass substrate has a liquidus viscosity from 3 kilopoise (kP) to 50 kP.

A seventeenth aspect A17 includes the electronic device according to any of the foregoing aspects A15 and A16, wherein the glass substrate is strengthened by ion exchange in a 100% $NaNO_3$ bath at 430° C. for from 2 hours to 4 hours to form a strengthened glass article, and the strengthened glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension from 140 MPa to 210 MPa.

An eighteenth aspect A18 includes the electronic device according to any of the foregoing aspects A15-A17, wherein the glass substrate is strengthened by said ion exchange in the 100% $NaNO_3$ bath at 430° C. for from 3 to 4 hours to form a strengthened glass article, and the strengthened glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension greater than or equal to 150 MPa.

A nineteenth aspect A19 includes the electronic device according to any of the foregoing aspects A15-A18, wherein the glass substrate has a refractive index at 589.3 nm of from 1.5 to 1.6.

Additional features and advantages of the glass substrates and glass articles described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 4A is a photograph showing the fragmentation pattern of a glass article ion exchanged in a 2 wt. % $NaNO_3$ bath after impact with a tungsten carbide tip;

FIG. 4B is a photograph showing the fragmentation pattern of a glass article ion exchanged in a 2.33 wt. % $NaNO_3$ bath after impact with a tungsten carbide tip;

FIG. 4C is a photograph showing the fragmentation pattern of a glass article ion exchanged in a 2.66 wt. % $NaNO_3$ bath after impact with a tungsten carbide tip; and FIG. 4D is a photograph showing the fragmentation pattern of a glass article ion exchanged in a 3 wt. % $NaNO_3$ bath after impact with a tungsten carbide tip.

DETAILED DESCRIPTION

Figure 1A:
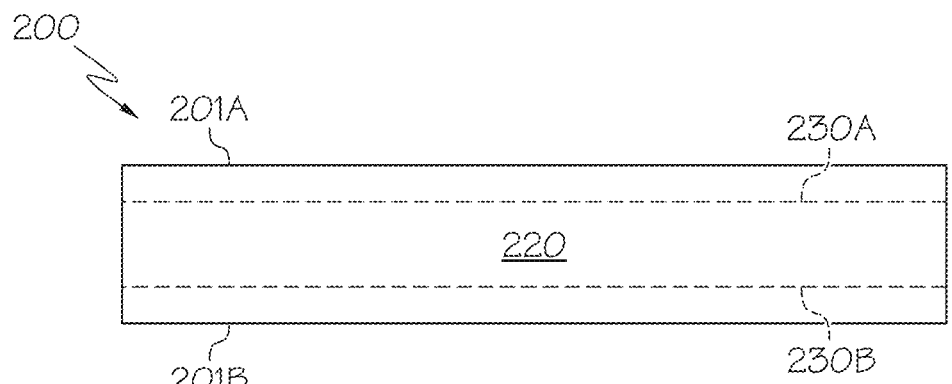
FIG. 1A is cross-sectional view of an exemplary ion exchanged glass article in accordance with embodiments described herein.

Reference will now be made in detail to various embodiments of glass substrates having relatively high Young's moduli and relatively high liquidus viscosities that may be strengthened by ion exchange to form glass articles having relatively high central tensions and relatively high surface compressive stresses. According to one embodiment, a glass substrate comprises a glass composition. The glass composition comprises from 60 mol. % to 75 mol. % $SiO_2$; from 2 mol. % to 15 mol. % $Li_2O$; from 1.9 mol. % to 15 mol. % $Y_2O_3$; and at least one of $B_2O_3$ and $Na_2O$. $B_2O_3+Na_2O$ may be from 2 mol. % to 13 mol. %; $Y_2O_3+Al_2O_3$ may be from 10 mol. % to 24 mol. %; a ratio $R_2O/Al_2O_3$ may be from 0.5 to 4, where $R_2O$ is a total concentration of $Li_2O$, $Na_2O$, $K_2O$, $Rb_2O$, and $Cs_2O$; $(R_2O+RO)/Al_2O_3$ may be from 0.5 to 4.5, where RO is a total concentration of BeO, MgO, CaO, SrO, and BaO; the glass substrate may have a Young's modulus from 75 gigapascals (GPa) to 110 GPa. The glass substrate is ion exchangeable to form a glass article. Various embodiments of glass compositions, glass substrates, and glass articles, as well as the properties thereof, will be described herein with specific reference to the appended drawings.

As used herein, the terms "glass," "glass article," and "glass substrates" are used in their broadest sense to include any object made wholly or partly of glass and/or glass ceramic, including laminates of glass and non-glass materials, laminates comprising glass and polymers, laminates of glass and crystalline materials, and glass-ceramics (including an amorphous phase and a crystalline phase).

In the embodiments described herein, the concentrations of constituent components (e.g., $SiO_2$, $Al_2O_3$, and the like) are specified in mole percent (mol. %) on an oxide basis, unless otherwise specified.

The terms "free" and "substantially free," when used to describe the concentration and/or absence of a particular constituent component in a glass composition, means that the constituent component is not intentionally added to the glass composition. However, the glass composition may contain traces of the constituent component as a contaminant or tramp in amounts of less than 0.05 mol. %.

The glass substrates described herein may be chemically strengthened by, for example, ion exchange and may exhibit stress profiles that are distinguished from those exhibited by known strengthened glass articles. In this disclosure, "glass substrates" are unstrengthened and "glass articles" are glass substrates that have been strengthened (by, for example, ion exchange). In this process, ions at or near the surface of the glass substrate are replaced by—or exchanged with—larger ions having the same valence or oxidation state at a temperature below the glass transition temperature to form a strengthened glass article. Without intending to be bound by any particular theory, it is believed that in those embodiments in which the glass substrate comprises an alkali aluminosilicate glass, ions in the surface layer of the glass substrate and the larger ions are monovalent alkali metal cations, such as $Li^+$ (when present in the glass article), $Na^+$, $K^+$, $Rb^+$, and $Cs^+$. Alternatively, monovalent cations in the surface layer may be replaced with monovalent cations other than alkali metal cations, such as $Ag^+$ or the like. In such embodiments, the monovalent ions (or cations) exchanged into the glass substrate generate a stress in the resulting glass article.

Figure 1B:
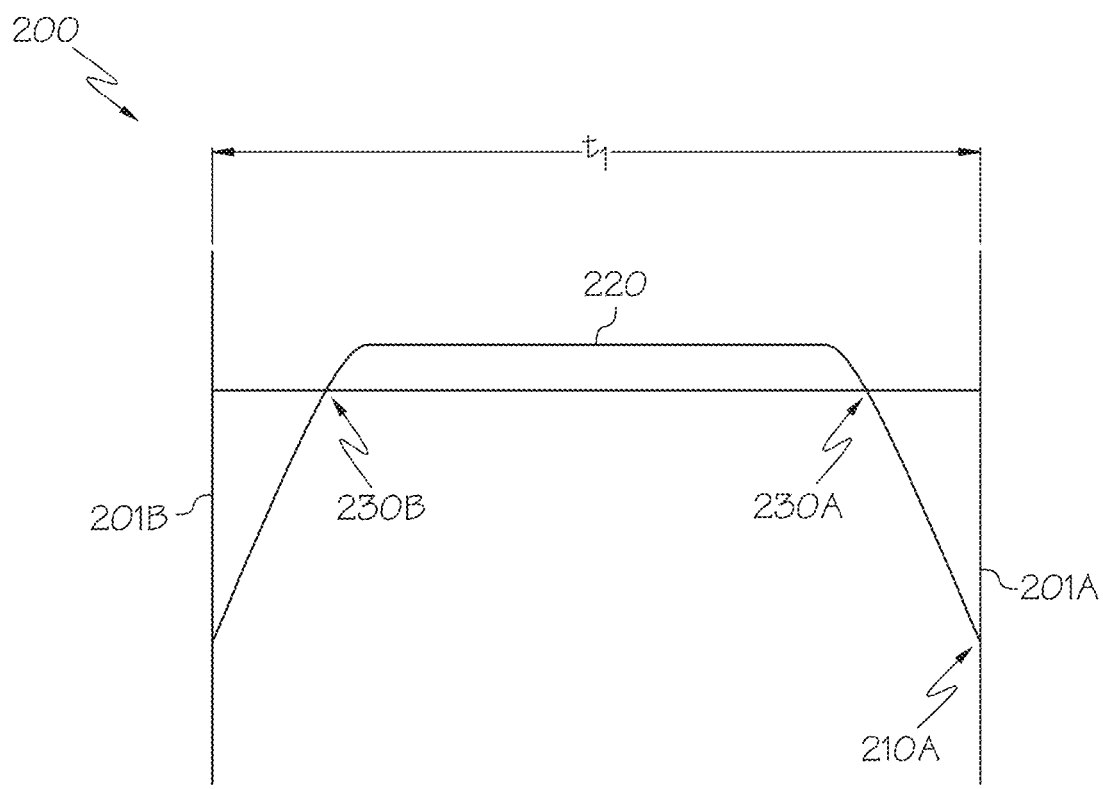
FIG. 1B is a stress profile of a glass article through a cross-section as a function of depth from the surface in accordance with embodiments described herein.
Figure 2:
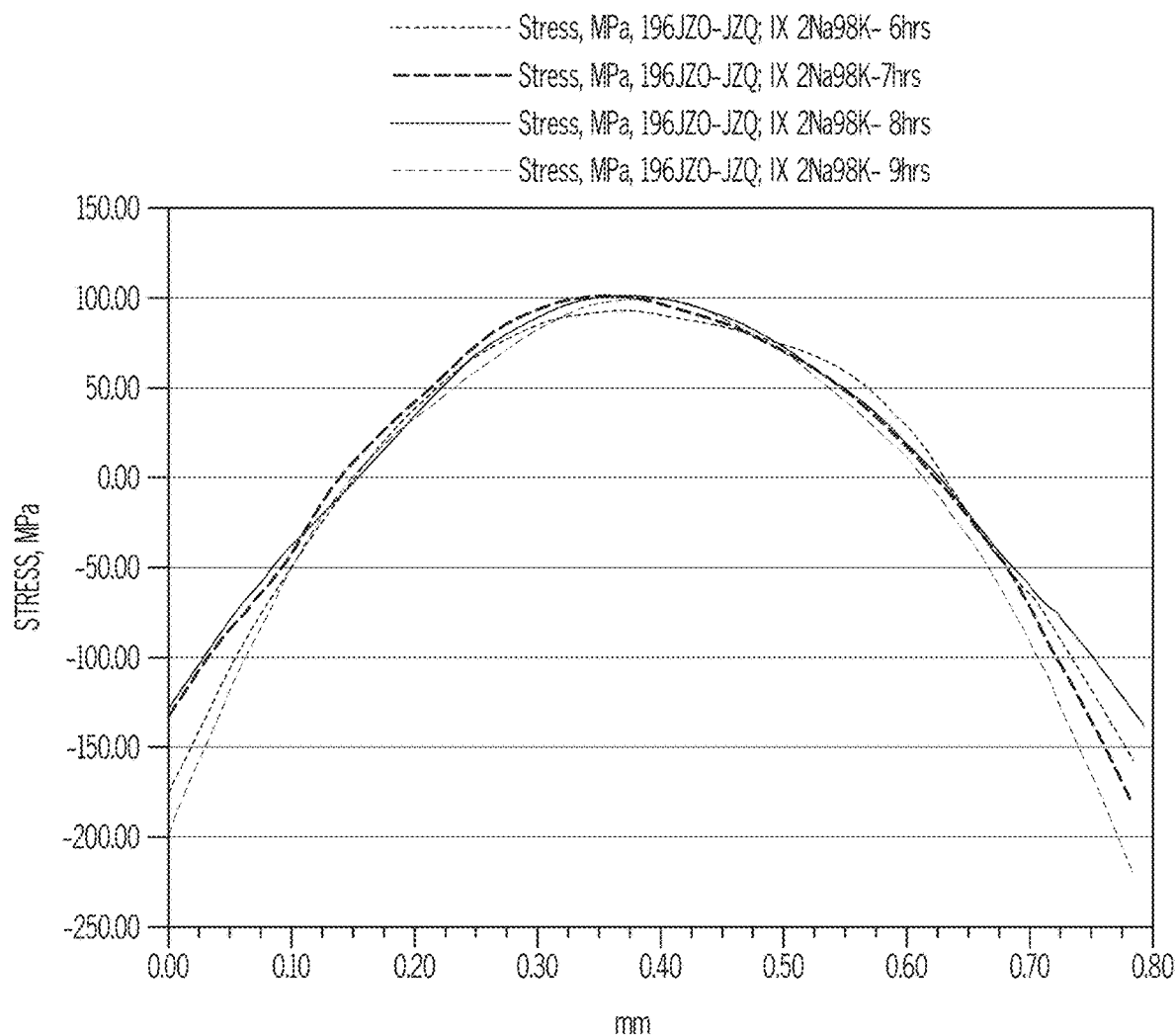
FIG. 2 is a graph showing the stress profiles through the thickness of a 0.8 mm-thick glass article ion exchanged for 6 hours, 7 hours, 8 hours, and 9 hours in accordance with embodiments described herein.
Figure 3B:
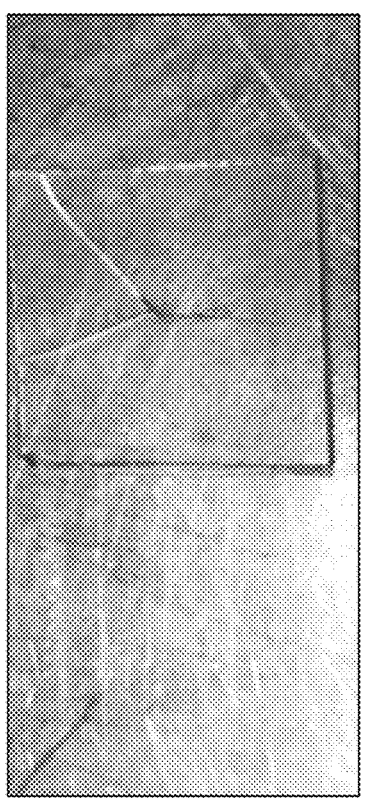
FIG. 3B is a photograph showing the fracture pattern for the embodiment when ion exchanged for 7 hours as shown in FIG. 2, as consequence of impact with a tungsten carbide tip.
Figure 3D:
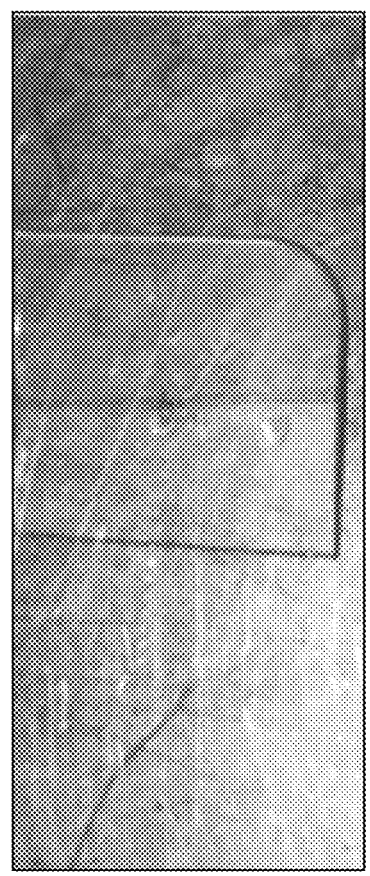
FIG. 3D is a photograph showing the fracture pattern for the embodiment when ion exchanged for 9 hours as shown in FIG. 2, as a consequence of impact with a tungsten carbide tip.
Figure 3A:
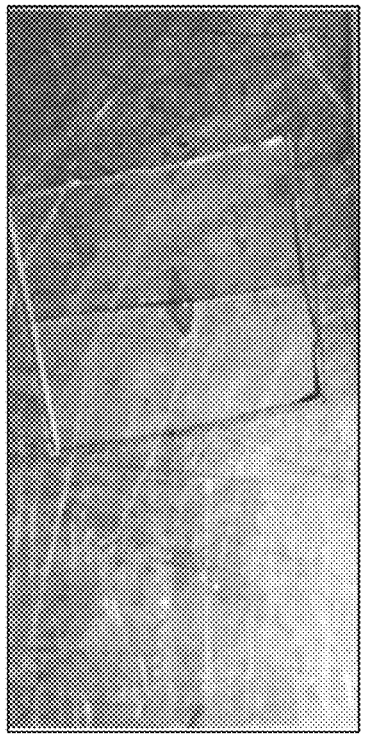
FIG. 3A is a photograph showing the fracture pattern for the embodiment when ion exchanged for 6 hours as shown in FIG. 2, as consequence of impact with a tungsten carbide tip.
Figure 3C:
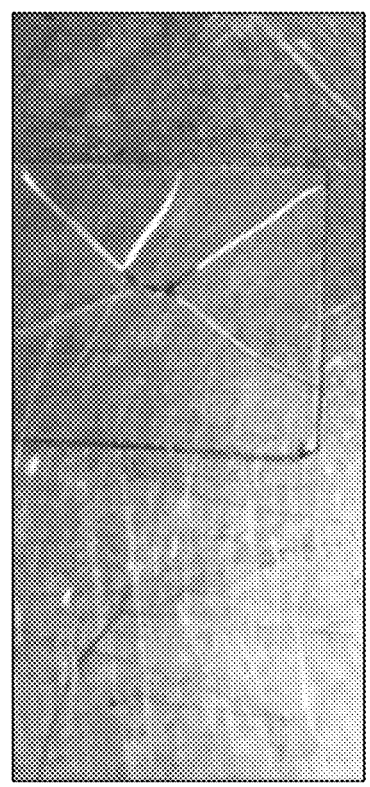
FIG. 3C is a photograph showing the fracture pattern for the embodiment when ion exchanged for 8 hours as shown in FIG. 2, as consequence of impact with a tungsten carbide tip.

A cross-section view of an exemplary ion exchanged glass article 200 is shown in FIG. 1A and typical stress profile obtained by ion exchange is shown in FIG. 1B. The ion exchanged glass article 200 includes a first surface 201A, a second surface 201B, and a thickness ti between the first surface 201A and the second surface 201B. In some embodiments, the ion exchanged glass article 200 may exhibit a compressive stress, as that term is defined below, that decreases from the first surface 201A to a depth of compression 230A, as that term is defined below, until it reaches a region of central tension 220 having a maximum central tension. Accordingly, in such embodiments, the region of central tension 220 extends from the depth of compression 230A towards the second surface 201B of the glass article 200. Likewise, the ion exchanged glass article 200 exhibits a compressive stress 210B that decreases from the second surface 201B to a depth of compression 230B until it reaches a region of central tension 220 having a maximum central tension. Accordingly, the region of central tension 220 extends from the depth of compression 230B towards the first surface 201A such that the region of central tension 220 is disposed between the depth of compression 230B and the depth of compression 230A. The stress profile in the ion exchanged glass article 200 may have various configurations. For example and without limitation, the stress profile may be similar to an error function, such as the stress profile depicted in FIG. 1B. However, it should be understood that other shapes are contemplated and possible, including parabolic stress profiles (e.g., as depicted in FIG. 2) or the like.

Ion exchange processes are typically carried out by immersing a glass substrate in a molten salt bath (or two or more molten salt baths) containing the larger ions to be exchanged with the smaller ions in the glass substrate. It should be noted that aqueous salt baths may also be utilized. In addition, the composition of the bath(s) may include more than one type of larger ion (e.g., $Na^+$ and $K^+$) or a single larger ion. It will be appreciated by those skilled in the art that parameters for the ion exchange process, including, but not limited to, bath composition and temperature, immersion time, the number of immersions of the glass substrate in a salt bath (or baths), use of multiple salt baths, additional steps such as annealing, washing, and the like, are generally determined by the composition of the glass substrate (including the structure of the glass substrate and any crystalline phases present) and the desired depth of compression and compressive stress, as those terms are defined below, of the glass article that results from strengthening. By way of example, ion exchange of glass substrates may be achieved by immersion of the glass substrates in at least one molten bath containing a salt such as, but not limited to, nitrates, sulfates, and chlorides of the larger alkali metal ion. Typical nitrates include $KNO_3$, $NaNO_3$, $LiNO_3$, and combinations thereof. In one or more embodiments, $NaSO_4$ may be used, as well, with or without a nitrate. The temperature of the molten salt bath typically is in a range from about 370° C. up to about 480° C., while immersion times range from about 15 minutes up to about 100 hours depending on glass thickness, bath temperature, and glass (or monovalent ion) diffusivity. However, temperatures and immersion times different from those described above may also be used.

In one or more embodiments, the glass substrate may be immersed in a molten salt bath of 100% $NaNO_3$ having a temperature from about 370° C. to about 480° C. In some embodiments, the glass substrate may be immersed in a molten mixed salt bath including from about 5% to about 30% $KNO_3$ and from about 70% to about 95% $NaNO_3$. In some embodiments, the glass substrate may be immersed in a molten mixed salt bath including $Na_2SO_4$ and $NaNO_3$ and have a wider temperature range (e.g., up to about 500° C.). In one or more embodiments, the glass article may be immersed in a second bath, after immersion in a first bath. Immersion in a second bath may include immersion in a molten salt bath including 100% $KNO_3$ for 15 minutes to 8 hours, for example.

In one or more embodiments, the glass substrate may be immersed in a molten, mixed salt bath including $NaNO_3$ and $KNO_3$ (e.g., 49%/51%, 50%/50%, 51%/49%, or even 80%/20%) for less than about 5 hours, or even about 4 hours or less. In one or more embodiments, the glass substrate may be immersed in a molten, mixed salt bath including from 75% to 85% $NaNO_3$ and from 15% to 25% $KNO_3$ for from 2 hours to 16 hours.

Ion exchange conditions can, but need not, be tailored to provide a "spike" or to increase the slope of the stress profile at or near the surface of the resulting glass article. This spike can be achieved by a single ion-exchange bath or multiple baths, with the bath(s) having a single composition or mixed composition, due to the unique properties of the glass compositions used in the glass articles described herein.

As used herein, "DOC" or "depth of compression" refers to the depth at which the stress within the glass article changes from compressive to tensile stress. At the DOC, the stress crosses from a negative (compressive) stress to a positive (tensile) stress.

According to the convention normally used in the art, compression is expressed as a negative (<0) stress and tension is expressed as a positive (>0) stress, unless specifically noted otherwise. Throughout this description, however, when speaking in terms of compressive stress CS, such is given without regard to positive or negative values—i.e., as recited herein, CS=|CS|.

CS is measured with a surface stress meter (FSM) using commercially available instruments such as the FSM-6000, manufactured by Orihara Industrial Co., Ltd. (Japan). Surface stress measurements rely upon the measurement of the stress optical coefficient (SOC), which is related to the birefringence of the glass substrate or glass article. SOC may be measured using the disc method according to ASTM standard C770-16 (2016), entitled "Standard Test Method for Measurement of Glass Stress-Optical Coefficient," the contents of which are incorporated herein by reference in their entirety. This method includes using a glass disc as the specimen with a thickness of 5 to 10 mm and a diameter of 12.7 mm, wherein the disc is isotropic and homogeneous and core drilled with both faces polished and parallel.

DOC and maximum central tension (or "maximum CT") values are measured using either a refracted near-field (RNF) method or scattered light polariscope (SCALP). Either may be used to measure the stress profile. When the RNF method is utilized, the maximum CT value provided by SCALP is utilized. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample," which is incorporated herein by reference in its entirety. In particular, the RNF method includes placing the glass sample adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal. The RNF profile is then smoothed. As noted above, the FSM technique is used for the surface CS and slope of the stress profile in the CS region near the surface.

As used herein, the terms "chemical depth," "chemical depth of layer," and "depth of chemical layer" may be used interchangeably and refer to the depth at which an ion of the metal oxide or alkali metal oxide (e.g., the metal ion or alkali metal ion) diffuses into the glass article and the depth at which the concentration of the ion reaches a minimum value, as determined by Electron Probe Micro-Analysis (EPMA) or Glow Discharge-Optical Emission Spectroscopy (GD-OES). In particular, the depth of $Na_2O$ diffusion or Na+ ion concentration or the depth of $K_2O$ diffusion or K+ ion concentration may be determined using EPMA or GD-OES.

The fracture toughness $K_{1C}$ value recited in this disclosure refers to a value as measured by the chevron notched short bar (CNSB) method disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988), which is incorporated herein by reference in its entirety, except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992), which is incorporated herein by reference in its entirety.

Density is determined by the buoyancy method according to ASTM C693-93 (2019), titled "Standard Test Method for Density of Glass by Buoyancy," which is incorporated herein by reference in its entirety.

Young's modulus $E_{mod}$, Poisson's ratio, and shear modulus values recited in this disclosure refer to values measured by a resonant ultrasonic spectroscopy technique set forth in ASTM C623-92 (2015), titled "Standard Test Method for Young's Modulus, Shear Modulus, and Poisson's Ratio for Glass and Glass-Ceramics by Resonance," which is incorporated herein by reference in its entirety.

As used herein, the term "Poisson's ratio" means the ratio of the proportional decrease in a lateral measurement to the proportional increase in length in a sample of a glass article, as described herein, which is elastically stretched.

The stored strain energy $\Sigma_0$ may be calculated according to the following equation (I):

$$\Sigma_0 = \frac{1-v}{E_{mod}} \int_{-z}^{+z} \sigma^2 dz \qquad (I)$$

where v is Poisson's ratio, $E_{mod}$ is Young's modulus (in MPa), σ is stress (in MPa), z*=0.5t', z being the depth and t' being the thickness (in micrometers) of the tensile region only (i.e., the thickness of the region between the depth of compression 230A and the depth of compression 230B in FIG. 1B).

Critical strain energy release rate $G_{1C}$ was calculated according to the following equation (II):

$$G_{1C} = \frac{K_{1C}^2}{E_{mod}} \qquad (II)$$

where $K_{1C}$ is the fracture toughness and $E_{mod}$ is the Young's modulus. $G_{1C}$ is conventionally reported in units of $J/m^2$.

The terms "strain point" and "$T_{strain}$" as used herein, refer to the temperature at which the viscosity of the glass composition is $3 \times 10^{14.7}$ poise. The term "annealing point," as used herein, refers to the temperature at which the viscosity of the glass composition is $1 \times 10^{13.2}$ poise. The term "softening point," as used herein, refers to the temperature at which the viscosity of the glass composition is $1 \times 10^{7.6}$ poise.

Strain and annealing points are measured according to the beam bending viscosity method which measures the viscosity of inorganic glass from $10^{12}$ to $10^{14}$ poise as a function of temperature in accordance with ASTM C598-93 (2019), titled "Standard Test Method for Annealing Point and Strain Point of Glass by Beam Bending," which is incorporated herein by reference in its entirety.

The softening point was measured according to the parallel plate viscosity method which measures the viscosity of inorganic glass from $10^7$ to $10^9$ poise as a function of temperature, similar to the ASTM C1351M-96 (2017), titled "Standard Test Method for Measurement of Viscosity of Glass Between $10^4$ Pa·s and $10^8$ Pa·s by Viscous Compression of a Solid Right Cylinder," which is incorporated herein by reference in its entirety.

As used herein, the term "liquidus viscosity" refers to the viscosity of a molten glass composition at the liquidus temperature, wherein the term "liquidus temperature" refers to the temperature at which crystals first appear as a molten glass composition cools down from the melting temperature (or the temperature at which the very last crystals melt away as temperature is increased from room temperature). In general, the glass compositions described herein have a liquidus viscosity of less than about 100 kilopoise (kP). In some embodiments, the glass compositions exhibit a liquidus viscosity of less than about 80 kP, less than about 60 kP, less than about 40 kP, less than about 30 kP, less than about 20 kP, or even less than about 10 kP (e.g., in the range from about 0.5 kP to about 10 kP). The liquidus viscosity is determined by the following method. First the liquidus temperature of the glass compositions is measured in accordance with ASTM C829-81 (2015), titled "Standard Practice for Measurement of Liquidus Temperature of Glass by the Gradient Furnace Method," which is incorporated herein by reference in its entirety. Next the viscosity of the glass compositions at the liquidus temperature is measured in accordance with ASTM C965-96 (2017), titled "Standard Practice for Measuring Viscosity of Glass Above the Softening Point," which is incorporated herein by reference in its entirety.

Hardness is measured using a MITUTOYO HM 114 Hardness testing machine with a Vickers indenter with a 200 gram indentation load (dwell time is 15 seconds). Measurement of indentation diagonals is performed using calibrated optical microscopy. Values are an average of measurements from 5 indentations per sample. Tests are performed on optically polished samples with plane parallel faces.

As used herein, "index of refraction" or "refractive index" refers to the ratio of the speed of light in vacuum (or air) to the speed of light in the glass. The refractive index is measured with a Bausch & Lomb Precision Refractometer, which measures the refractive index of a material by measuring the critical angle, defined as the angle of incidence that provides an angle of refraction of 90°. The refractive index measurements were performed at the sodium D wavelength (589.3 nm) with a sodium arc lamp.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply ab solute orientation.

Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or where any apparatus claim does not actually recite an order or orientation to individual components, or it is not otherwise specifically stated in the claims or description that the steps are to be limited to a specific order, or that the components of an apparatus are to be limited to a specific order or orientation, it is in no way intended that an order or orientation be inferred, in any respect. This holds for any possible non-express basis for interpretation, including: matters of logic with respect to arrangement of steps, operational flow, order of components, or orientation of components, plain meaning derived from grammatical organization or punctuation, and the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

Glass articles that survive repeated drops on damaging surfaces are well suited for applications requiring rugged components, such as for touch screens of electronic devices and the like. Some glass articles made with superior resistance to breakage are formed so as to have a specific fragmentation pattern upon failure. For example, the glass articles may be formed so as to exhibit a fragmentation density of greater than about 5 fragments/cm' of the glass article when subjected to a point impact by an object or a drop onto a solid surface with sufficient force to break the glass article into multiple small pieces. Stored strain energy (SSE) may be an indication of a glass article having a desirable fragmentation pattern. For example, glass articles with a stored strain energy greater than about 20 J/m$^2$ or even greater than about 24 J/m$^2$ may exhibit a fragmentation density of greater than about 5 fragments/cm'.

Disclosed herein is a novel composition space of silicate glass compositions containing $Li_2O$ and $Y_2O_3$ having relatively high Young's moduli and relatively high liquidus viscosities that may be strengthened by ion exchange to form glass articles having relatively high central tensions and relatively high surface compressive stresses, greater than 800 MPa, if desired. Due to the higher fracture toughness and Young's moduli, the frangibility limit of the glass articles is higher than previously known strengthened glass articles, yielding an advantage in the amount of stress that can be supported and thereby improving mechanical performance. The glass articles can also achieve sufficiently high CT values and correspondingly high stored strain energy to exhibit a diced fragmentation pattern as a result of flaw introduction, which may be an advantage in some applications. Further, the full stress profile associated with the term "high CT" has a positive impact on mechanical performance, particularly drop performance. The glass composition space represents an addition to the set of glass compositions enabling more stress and accordingly improved mechanical performance.

The glass compositions disclosed herein take advantage of the significant effect that $Y_2O_3$ has on increasing the Young's modulus of oxide glasses. However, the glass compositions described herein contain less $Y_2O_3$ than in the previous glass compositions to enhance: 1) manufacturability; and 2) ion-exchangeability. These glass compositions having lower $Y_2O_3$ concentrations (e.g., ≤15 mol. %) exhibit less extreme glass properties, although the $E_{mod}$, $K_{1C}$, and hardness are still noticeably, and measurably, above the range of previously known glass compositions. The glass substrates (prior to ion exchange) and the glass articles (after ion exchange) comprising the glass compositions described herein also have strain points up to 750° C. Such high strain points make it possible to ion-exchange glass substrates comprising these glass compositions at elevated temperatures (which speeds up diffusivity) with minimal stress relaxation. Stress relaxation is defined by the equation $\sigma = \sigma_0 e^{-Gt/\eta}$, where $\sigma_0$ is the maximum stress in the glass prior to relaxation, G is the shear modulus of the glass, t is time, and $\eta$ is the viscosity.

In one or more embodiments, $SiO_2$ is the largest constituent of the glass composition and, as such, is the primary constituent of the resulting glass network. That is, $SiO_2$ is the primary glass-forming oxide. $SiO_2$ enhances the viscosity (strain, anneal, softening points, as well as the liquidus viscosity) of the glass composition, which may in turn enhance forming and may also lower the CTE. Accordingly, a high $SiO_2$ concentration is generally desired. However, if the content of $SiO_2$ is too high, the formability of the glass composition may be diminished as higher concentrations of $SiO_2$ may increase the difficulty of melting, softening, and molding the glass composition, which in turn, adversely impacts the formability of the glass composition. If the $SiO_2$ content is too high or too low, the liquidus temperature may be increased (hence the liquidus viscosity may be decreased), which may also reduce formability of the glass composition.

In embodiments, the glass composition may include $SiO_2$ in an amount greater than or equal to 60 mol. %. The amount of $SiO_2$ may be less than or equal to 75 mol. %. Accordingly, in embodiments of the glass composition, the glass composition may comprise $SiO_2$ in an amount from 60 mol. % to 75 mol. %. In embodiments, the lower bound of the amount of $SiO_2$ in the glass composition may be greater than or equal to 60 mol. %, greater than or equal to 61 mol. %, greater than or equal to 62 mol. %, greater than or equal to 63 mol. %, greater than or equal to 64 mol. %, greater than or equal to 65 mol. %, greater than or equal to 66 mol. %, greater than or equal to 67 mol. %, or even greater than or equal to 68 mol. %. In embodiments, the upper bound of the amount of $SiO_2$ in the glass composition may be less than or equal to 75 mol. %, less than or equal to 74 mol. %, less than or equal to 73 mol. %, less than or equal to 72 mol. %, less than or equal to 71 mol. %, less than or equal to 70 mol. %, or even less than or equal to 69 mol. %. It should be understood that the amount of $SiO_2$ in the glass composition may be within a range formed from any one of the lower bounds for $SiO_2$ and any one of the upper bounds of $SiO_2$ described herein.

For example and without limitation, in embodiments, the glass composition may include from 60 mol. % to 75 mol. % $SiO_2$. In embodiments, the glass composition may include from 61 mol. % to 74 mol. % $SiO_2$. In embodiments, the glass composition may include from 62 mol. % to 73 mol. % $SiO_2$. In embodiments, the glass composition may include from 63 mol. % to 72 mol. % $SiO_2$. In embodiments, the glass composition may include from 64 mol. % to 71 mol. % $SiO_2$. In embodiments, the glass composition may include from 65 mol. % to 70 mol. % $SiO_2$. In embodiments, the glass composition may include from 66 mol. % to 69 mol. % $SiO_2$. In embodiments, the glass composition may include from 67 mol. % to 68 mol. % $SiO_2$. In embodiments, the glass composition may include from 60 mol. % to 74 mol. % $SiO_2$. In embodiments, the glass composition may include from 60 mol. % to 73 mol. % $SiO_2$. In embodiments, the glass composition may include from 60 mol. % to 72 mol. % $SiO_2$. In embodiments, the glass composition may include from 60 mol. % to 71 mol. % $SiO_2$. In embodiments, the glass composition may include from 60 mol. % to 70 mol. % $SiO_2$. In embodiments, the glass composition may include from 60 mol. % to 69 mol. % $SiO_2$. In embodiments, the glass composition may include from 61 mol. % to 75 mol. % $SiO_2$. In embodiments, the glass composition may include from 62 mol. % to 75 mol. % $SiO_2$. In embodiments, the glass composition may include from 63 mol. % to 75 mol. % $SiO_2$. In embodiments, the glass composition may include from 64 mol. % to 75 mol. % $SiO_2$. In embodiments, the glass composition may include from 65 mol. % to 75 mol. % $SiO_2$. In embodiments, the glass composition may include from 66 mol. % to 75 mol. % $SiO_2$. In embodiments, the glass composition may include from 67 mol. % to 75 mol. % $SiO_2$. In embodiments, the glass composition may include from 61 mol. % to 69 mol. % $SiO_2$.

The glass composition also includes one or more alkali oxides. The sum of all alkali oxides (in mol. %) is expressed herein as $R_2O$. Specifically, $R_2O$ is the sum of $Li_2O$ (mol. %), $Na_2O$ (mol. %), $K_2O$ (mol. %), $Rb_2O$ (mol. %), and $Cs_2O$ (mol. %) present in the glass composition. Without intending to be bound by any particular theory, it is believed that the alkali oxides aid in decreasing the softening point of the glass composition, thereby offsetting the increase in the softening point of the glass composition due to the amount of $SiO_2$ in the glass composition. The decrease in the softening point may be further enhanced by including combinations of alkali oxides (e.g., two or more alkali oxides) in the glass composition, a phenomenon referred to as the "mixed alkali effect." Additionally, the presence of $R_2O$ may enable chemical strengthening of the resultant glass substrate by ion exchange thereby facilitating formation of a strengthened glass article. Because the maximum CT is dependent on the amount of alkali that can be ion exchanged into the glass substrate, in some embodiments, the glass composition may have at least 9 mol. % $R_2O$.

In embodiments, the amount of alkali oxide (i.e., the amount of $R_2O$) in the glass composition may be from 9 mol. % to 15 mol. %. If the $R_2O$ content is too low, there may be too few ions to exchange and the resultant stress after ion exchange is too low. If, however, the $R_2O$ content is too high, the glass may become unstable, may devitrify, and may exhibit poor chemical durability. In embodiments, the lower bound of the amount of $R_2O$ in the glass composition may be greater than or equal to 9 mol. %, greater than or equal to 9.25 mol. %, greater than or equal to 9.5 mol. %, greater than or equal to 9.75 mol. %, greater than or equal to 10 mol. %, greater than or equal to 10.25 mol. %, greater than or equal to 10.5 mol. %, greater than or equal to 10.75 mol. %, greater than or equal to 11 mol. %, greater than or equal to 11.25 mol. %, greater than or equal to 11.5 mol. %, greater than or equal to 11.75 mol. %, greater than or equal to 12 mol. %, greater than or equal to 12.25 mol. %, or even greater than or equal to 12.5 mol. %. In embodiments, the upper bound of the amount of $R_2O$ in the glass composition may be less than or equal to 15 mol. %, less than or equal to 14.75 mol. %, less than or equal to 14.5 mol. %, less than or equal to 14.25 mol. %, less than or equal to 14 mol. %, less than or equal to 13.75 mol. %, less than or equal to 13.5 mol. %, less than or equal to 13.25 mol. %, less than or equal to 13 mol. %, or even less than or equal to 12.75 mol. %. It should be understood that the amount of $R_2O$ in the glass compositions may be within a range formed from any one of the lower bounds for $R_2O$ and any one of the upper bounds of $R_2O$ described herein.

For example and without limitation, the glass compositions may include $R_2O$ in an amount from 9 mol. % to 15 mol. %. In embodiments, the amount of $R_2O$ in the glass composition is from 9 mol. % to 14.75 mol. %. In embodiments, the amount of $R_2O$ in the glass composition is from 9 mol. % to 14.5 mol. %. In embodiments, the amount of $R_2O$ in the glass composition is from 9 mol. % to 14.25 mol. %. In embodiments, the amount of $R_2O$ in the glass composition is from 9 mol. % to 14 mol. % In embodiments, the amount of $R_2O$ in the glass composition is from 9 mol. % to 13.75 mol. %. In embodiments, the amount of $R_2O$ in the glass composition is from 9 mol. % to 13.5 mol. %. In embodiments, the amount of $R_2O$ in the glass composition is from 9 mol. % to 13.25 mol. %. In embodiments, the amount of $R_2O$ in the glass composition is from 9 mol. % to 13 mol. %. In embodiments, the amount of $R_2O$ in the glass composition is from 9 mol. % to 12.75 mol. %. In embodiments, the amount of $R_2O$ in the glass composition is from 9.25 mol. % to 15 mol. %. In embodiments, the amount of $R_2O$ in the glass composition is from 9.5 mol. % to 15 mol. %. In embodiments, the amount of $R_2O$ in the glass composition is from 9.75 mol. % to 15 mol. %. In embodiments, the amount of $R_2O$ in the glass composition is from 10 mol. % to 15 mol. % In embodiments, the amount of $R_2O$ in the glass composition is from 10.25 mol. % to 15 mol. %. In embodiments, the amount of $R_2O$ in the glass composition is from 10.5 mol. % to 15 mol. %. In embodiments, the amount of $R_2O$ in the glass composition is from 10.75 mol. % to 15 mol. %. In embodiments, the amount of $R_2O$ in the glass composition is from 11 mol. % to 15 mol. %. In embodiments, the amount of $R_2O$ in the glass composition is from 11.25 mol. % to 15 mol. %. In embodiments, the amount of $R_2O$ in the glass composition is from 11.5 mol.

% to 15 mol. %. In embodiments, the amount of $R_2O$ in the glass composition is from 11.75 mol. % to 15 mol. %. In embodiments, the amount of $R_2O$ in the glass composition is from 12 mol. % to 15 mol. % In embodiments, the amount of $R_2O$ in the glass composition is from 12.25 mol. % to 15 mol. %. In embodiments, the amount of $R_2O$ in the glass composition is from 12.5 mol. % to 15 mol. %.

In embodiments, $R_2O$ includes at least $Li_2O$. Without intending to be bound by any particular theory, it is believed that $Li_2O$ contributes to enhanced stiffness, fracture toughness, critical strain release rate, and Young's modulus of the glass article. Additionally, $Li^+$ has a high diffusivity through the glass network, which enables ion exchange times of less than 24 hours for samples thinner than 1 mm when $Na^+$ is ion exchanged for $Li^+$ in the glass substrate.

In embodiments of the glass composition, $Li_2O$ may be present in the glass composition in an amount greater than or equal to 2 mol. %. The amount of $Li_2O$ in the glass composition may be less than or equal to 15 mol. %. If the $Li_2O$ is too low, too few ions are available to ion exchange and the resultant stress after ion exchange is low. If, however, the $Li_2O$ content is too high, the glass may be unstable, may exhibit a liquidus viscosity that is too low, and may have poor chemical durability. Accordingly, the amount of $Li_2O$ in the glass composition is from 2 mol. % to 15 mol. %. In embodiments, the lower bound of the amount of $Li_2O$ in the glass composition may be greater than or equal to 2 mol. %, greater than or equal to 2.5 mol. %, greater than or equal to 3 mol. %, greater than or equal 3.5 mol. %, greater than or equal 4 mol. %, greater than or equal 4.5 mol. %, greater than or equal 5 mol. %, greater than or equal 5.5 mol. %, greater than or equal 6 mol. %, greater than or equal to 6.5 mol. %, greater than or equal 7 mol. %, greater than or equal 7.5 mol. %, greater than or equal 8 mol. %, or even greater than or equal to 8.5 mol. %. In embodiments, the upper bound of the amount of $Li_2O$ in the glass composition may be less than or equal to 15 mol. %, less than or equal to 14.5 mol. %, less than or equal to 14 mol. %, less than or equal to 13.5 mol. %, less than or equal to 13 mol. %, less than or equal to 12.5 mol. %, less than or equal to 12 mol. %, less than or equal to 11.5 mol. %, less than or equal to 11 mol. %, less than or equal to 10.5 mol. %, less than or equal to 10 mol. %, less than or equal to 9.5 mol. %, or even less than or equal to 9 mol. %. It should be understood that the amount of $Li_2O$ in the glass composition may be within a range formed from any one of the lower bounds for $Li_2O$ and any one of the upper bounds of $Li_2O$ described herein.

For example and without limitation, the glass composition may include $Li_2O$ in an amount from 2 mol. % to 15 mol. %. In embodiments, the amount of $Li_2O$ in the glass composition is from 2 mol. % to 14.5 mol. %. In embodiments, the amount of $Li_2O$ in the glass composition is from 5 mol. % to 14 mol. %. In embodiments, the amount of $Li_2O$ in the glass composition is from 5 mol. % to 13.5 mol. %. In embodiments, the amount of $Li_2O$ in the glass composition is from 5 mol. % to 13 mol. %. In embodiments, the amount of $Li_2O$ in the glass composition is from 5 mol. % to 12.5 mol. %. In embodiments, the amount of $Li_2O$ in the glass composition is from 5 mol. % to 12 mol. %. In embodiments, the amount of $Li_2O$ in the glass composition is from 5 mol. % to 11.5 mol. %. In embodiments, the amount of $Li_2O$ in the glass composition is from 5 mol. % to 11 mol. %. In embodiments, the amount of $Li_2O$ in the glass composition is from 5 mol. % to 10.5 mol. %. In embodiments, the amount of $Li_2O$ in the glass composition is from 5 mol. % to 10 mol. %. In embodiments, the amount of $Li_2O$ in the glass composition is from 5 mol. % to 9.5 mol. %. In embodiments, the amount of $Li_2O$ in the glass composition is from 5 mol. % to 9 mol. %. In embodiments, the amount of $Li_2O$ in the glass composition is from 5.5 mol. % to 15 mol. %. In embodiments, the amount of $Li_2O$ in the glass composition is from 6 mol. % to 15 mol. %. In embodiments, the amount of $Li_2O$ in the glass composition is from 6.5 mol. % to 15 mol. %. In embodiments, the amount of $Li_2O$ in the glass composition is from 7 mol. % to 15 mol. %. In embodiments, the amount of $Li_2O$ in the glass composition is from 7.5 mol. % to 15 mol. %. In embodiments, the amount of $Li_2O$ in the glass composition is from 8 mol. % to 15 mol. %. In embodiments, the amount of $Li_2O$ in the glass composition is from 8.5 mol. % to 15 mol. %.

To perform ion exchange, at least one relatively small alkali oxide ion (e.g., $Li^+$ or $Na^+$) is exchanged with larger alkali ions (e.g., $K^+$) from an ion exchange medium. In general, the three most common types of ion exchange are $Na^+$-for-$Li^+$, $K^+$-for-$Li^+$, and $K^+$-for-$Na^+$. The first type, $Na^+$-for-$Li^+$, produces glass articles having a large depth of layer but a small compressive stress. The second type, $K^+$-for-$Li^+$, produces glass articles having a small depth of layer but a large compressive stress. The third type, $K^+$-for-$Na^+$, produces glass articles with intermediate depth of layer and compressive stress.

In embodiments of the glass composition, the alkali oxide ($R_2O$) includes $Na_2O$. As noted herein, additions of alkali oxides such as $Na_2O$ decrease the softening point, thereby offsetting the increase in the softening point of the glass composition due to $SiO_2$ in the glass composition. Small amounts of $Na_2O$ and $K_2O$ may also help lower the liquidus temperature (hence increase the liquidus viscosity) of the glass composition. However, if the amount of $Na_2O$ is too high, the coefficient of thermal expansion of the glass composition becomes too high, which is undesirable. If the $Na_2O$ or $K_2O$ content is too high, the maximum achievable stress may be too low because the stress varies with the number of small ions in the glass substrate that can be exchanged by larger ions external to the glass substrate for forming a strengthened glass article.

In embodiments, the glass composition may be substantially free of $Na_2O$. In embodiments, the glass composition may be free of $Na_2O$. In embodiments of the glass composition that include $Na_2O$, the $Na_2O$ may be present in the glass composition in an amount greater than 0 mol. % to improve the formability of the glass composition and increase the rate of ion exchange. The amount of $Na_2O$ in the glass composition may be less than or equal to 13 mol. % so that the coefficient of thermal expansion is not undesirably high. Accordingly, the amount of $Na_2O$ in embodiments of the glass composition that include $Na_2O$ is from 0 mol. % to 13 mol. %. In such embodiments, the lower bound of the amount of $Na_2O$ in the glass composition may be greater than 0 mol. %, greater than or equal to 0.5 mol. %, greater than or equal to 1 mol. %, greater than or equal to 1.5 mol. %, greater than or equal to 2 mol. %, greater than or equal to 2.5 mol. %, greater than or equal to 3 mol. %, greater than or equal to 3.5 mol. %, greater than or equal to 4 mol. %, greater than or equal to 4.5 mol. %, greater than or equal to 5 mol. %, greater than or equal to 5.5 mol. %, greater than or equal to 6 mol. %, or even greater than or equal to 6.5 mol. %. In embodiments, the upper bound of the amount of $Na_2O$ in the glass composition may be less than or equal to 13 mol. %, less than or equal to 12.5 mol. %, less than or equal to 12 mol. %, less than or equal to 11.5 mol. %, less than or equal to 11 mol. %, less than or equal to 10.5 mol. %, less than or equal to 10 mol. %, less than or equal to 9.5 mol. %, less than or equal to 9 mol. %, less than or equal to 8.5 mol. %, less than or equal to 8 mol. %, less than or equal to 7.5 mol. %, or even less than or equal to 7 mol. %. It should be understood that the amount of $Na_2O$ in the glass composition may be within a range formed from any one of the lower bounds for $Na_2O$ and any one of the upper bounds of $Na_2O$ described herein. In embodiments, the amount of $Na_2O$ in the glass composition is greater than or equal to 0.5 mol. % and less than or equal to 3.5 mol. %.

For example and without limitation, the glass composition that includes $Na_2O$ may include $Na_2O$ in an amount from 0 mol. % to 13 mol. %. In embodiments, the amount of $Na_2O$ in the glass composition is from 0 mol. % to 12.5 mol. %. In embodiments, the amount of $Na_2O$ in the glass composition is from 0 mol. % to 12 mol. %. In embodiments, the amount of $Na_2O$ in the glass composition is from 0 mol. % to 11.5 mol. %. In embodiments, the amount of $Na_2O$ in the glass composition is from 0 mol. % to 11 mol. %. In embodiments, the amount of $Na_2O$ in the glass composition is from 0 mol. % to 10.5 mol. %. In embodiments, the amount of $Na_2O$ in the glass composition is from 0 mol. % to 10 mol. %. In embodiments, the amount of $Na_2O$ in the glass composition is from 0 mol. % to 9.5 mol. %. In embodiments, the amount of $Na_2O$ in the glass composition is from 0 mol. % to 9 mol. %. In embodiments, the amount of $Na_2O$ in the glass composition is from 0 mol. % to 8.5 mol. %. In embodiments, the amount of $Na_2O$ in the glass composition is from 0 mol. % to 8 mol. %. In embodiments, the amount of $Na_2O$ in the glass composition is from 0 mol. % to 7.5 mol. %. In embodiments, the amount of $Na_2O$ in the glass composition is from 0 mol. % to 7 mol. %. In embodiments, the amount of $Na_2O$ in the glass composition is from 0.5 mol. % to 13 mol. %. In embodiments, the amount of $Na_2O$ in the glass composition is from 1 mol. % to 13 mol. %. In embodiments, the amount of $Na_2O$ in the glass composition is from 1.5 mol. % to 13 mol. %. In embodiments, the amount of $Na_2O$ in the glass composition is from 2 mol. % to 13 mol. %. In embodiments, the amount of $Na_2O$ in the glass composition is from 2.5 mol. % to 13 mol. %. In embodiments, the amount of $Na_2O$ in the glass composition is from 3 mol. % to 13 mol. %. In embodiments, the amount of $Na_2O$ in the glass composition is from 3.5 mol. % to 13 mol. %. In embodiments, the amount of $Na_2O$ in the glass composition is from 4 mol. % to 13 mol. %. In embodiments, the amount of $Na_2O$ in the glass composition is from 4.5 mol. % to 13 mol. %. In embodiments, the amount of $Na_2O$ in the glass composition is from 5 mol. % to 13 mol. %. In embodiments, the amount of $Na_2O$ in the glass composition is from 5.5 mol. % to 13 mol. %. In embodiments, the amount of $Na_2O$ in the glass composition is from 6 mol. % to 13 mol. %. In embodiments, the amount of $Na_2O$ in the glass composition is from 6.5 mol. % to 13 mol. %.

The alkali oxide in the glass composition may optionally include $K_2O$. Like $Na_2O$, additions of $K_2O$ decrease the softening point of the glass composition, thereby offsetting the increase in the softening point of the glass composition due to $SiO_2$ in the glass composition. However, if the amount of $K_2O$ is too high, the ion exchange stress will be low and the coefficient of thermal expansion of the glass composition becomes too high, which is undesirable. Accordingly, it is desirable to limit the amount of $K_2O$ present in the glass composition.

In embodiments, the glass composition may be substantially free of $K_2O$. In embodiments, the glass composition may be free of $K_2O$. In embodiments where the alkali oxide includes $K_2O$, the $K_2O$ may be present in the glass composition in an amount greater than 0 mol. % to aid in improving the formability of the glass composition. When present, the amount of $K_2O$ is less than or equal to 1 mol. % so that the coefficient of thermal expansion is not undesirably high. Accordingly, the amount of $K_2O$ in embodiments of the glass composition that include $K_2O$ may be from 0 mol. % to 1 mol. %. In such embodiments, the lower bound of the amount of $K_2O$ in the glass composition may be greater than 0 mol. %, greater than or equal to 0.25 mol. %, or even greater than or equal to 0.5 mol. %. In embodiments, the upper bound of the amount of $K_2O$ in the glass composition may be less than or equal to 1 mol. %, or even less than or equal to 0.75 mol. %. It should be understood that the amount of $K_2O$ in the glass composition may be within a range formed from any one of the lower bounds for $K_2O$ and any one of the upper bounds of $K_2O$ described herein.

For example and without limitation, the glass composition having $K_2O$ may include $K_2O$ in an amount from 0 mol. % to 1 mol. %. In embodiments, the amount of $K_2O$ in the glass composition is from 0 mol. % to 0.75 mol. %. In embodiments, the amount of $K_2O$ in the glass composition is from 0.25 mol. % to 1 mol. %. In embodiments, the amount of $K_2O$ in the glass composition is from 0.5 mol. % to 1 mol. %. In embodiments, the amount of $K_2O$ in the glass composition is from 0.25 mol. % to 0.5 mol. %.

Embodiments of the glass composition includes $Y_2O_3$. $Y_2O_3$ is a high field strength modifier and is the lightest of the rare earth oxides (except $Sc_2O_3$, which may be prohibitively expensive) and thus may increase the specific modulus more than any other of the rare earth oxides. Correspondingly, $Y_2O_3$ may increase the frangibility limit after ion exchange, as well as the ion exchange stress and fracture toughness. It also does not typically impart any color to the glass, unlike the oxides of Ce, Pr, Nd, Pm, Sm, Eu, Tb, Dy, Ho, Er, and Tm. However, $Y_2O_3$ may decrease the diffusivity of alkali ions and thus slow ion exchange rates. It may also increase the liquidus temperature of the glass composition (hence lowering the liquidus viscosity) at high concentrations and increase batch cost. In such embodiments, the $Y_2O_3$ may be present in the glass composition in an amount less than or equal to 15 mol. %. In embodiments, the glass composition may comprise $Y_2O_3$ in an amount greater than or equal to 1.9 mol. %, greater than or equal to 2 mol. %, greater than or equal to 2.5 mol. %, greater than or equal to 3 mol. %, greater than or equal to 3.5 mol. %, greater than or equal to 4 mol. %, greater than or equal to 4.5 mol. %, greater than or equal to 5 mol. %, greater than or equal to 5.5 mol. %, greater than or equal to 6 mol. %, greater than or equal to 6.5 mol. %, greater than or equal to 7 mol. %, or even greater than or equal to 7.5 mol. %. In embodiments, the upper bound of the amount of $Y_2O_3$ may be less than or equal to 15 mol. %, less than or equal to 14.5 mol. %, less than or equal to 14 mol. %, less than or equal to 13.5 mol. %, less than or equal to 13 mol. %, less than or equal to 12.5 mol. %, less than or equal to 12 mol. %, less than or equal to 11.5 mol. %, less than or equal to 11 mol. %, less than or equal to 10.5 mol. %, less than or equal to 10 mol. %, less than or equal to 9.5 mol. %, less than or equal to 9 mol. %, less than or equal to 8.5 mol. %, or even less than or equal to 8 mol. %. It should be understood that the amount of $Y_2O_3$ in the glass composition may be within a range formed from any one of the lower bounds for $Y_2O_3$ and any one of the upper bounds of $Y_2O_3$ described herein.

For example and without limitation, the glass composition may include $Y_2O_3$ in an amount from 1.9 mol. % to 15 mol. %. In embodiments, the amount of $Y_2O_3$ in the glass composition is from 1.9 mol. % to 14.5 mol. %. In embodiments, the amount of $Y_2O_3$ in the glass composition is from 1.9 mol. % to 14 mol. %. In embodiments, the amount of $Y_2O_3$ in the glass composition is from 1.9 mol. % to 13.5 mol. %. In embodiments, the amount of $Y_2O_3$ in the glass composition is from 1.9 mol. % to 13 mol. %. In embodiments, the amount of $Y_2O_3$ in the glass composition is from 1.9 mol. % to 12.5 mol. %. In embodiments, the amount of $Y_2O_3$ in the glass composition is from 1.9 mol. % to 12 mol. %. In embodiments, the amount of $Y_2O_3$ in the glass composition is from 1.9 mol. % to 11.5 mol. %. In embodiments, the amount of $Y_2O_3$ in the glass composition is from 1.9 mol. % to 11 mol. %. In embodiments, the amount of $Y_2O_3$ in the glass composition is from 1.9 mol. % to 10.5 mol. %. In embodiments, the amount of $Y_2O_3$ in the glass composition is from 1.9 mol. % to 10 mol. %. In embodiments, the amount of $Y_2O_3$ in the glass composition is from 1.9 mol. % to 9.5 mol. %. In embodiments, the amount of $Y_2O_3$ in the glass composition is from 1.9 mol. % to 9 mol. %. In embodiments, the amount of $Y_2O_3$ in the glass composition is from 1.9 mol. % to 8.5 mol. %. In embodiments, the amount of $Y_2O_3$ in the glass composition is from 2 mol. % to 15 mol. %. In embodiments, the amount of $Y_2O_3$ in the glass composition is from 2.5 mol. % to 15 mol. %. In embodiments, the amount of $Y_2O_3$ in the glass composition is from 3 mol. % to 15 mol. %. In embodiments, the amount of $Y_2O_3$ in the glass composition is from 3.5 mol. % to 15 mol. %. In embodiments, the amount of $Y_2O_3$ in the glass composition is from 4 mol. % to 15 mol. %. In embodiments, the amount of $Y_2O_3$ in the glass composition is from 4.5 mol. % to 15 mol. %. In embodiments, the amount of $Y_2O_3$ in the glass composition is from 5 mol. % to 15 mol. %. In embodiments, the amount of $Y_2O_3$ in the glass composition is from 5.5 mol. % to 15 mol. %. In embodiments, the amount of $Y_2O_3$ in the glass composition is from 6 mol. % to 15 mol. %. In embodiments, the amount of $Y_2O_3$ in the glass composition is from 6.5 mol. % to 15 mol. %. In embodiments, the amount of $Y_2O_3$ in the glass composition is from 7 mol. % to 15 mol. %. In embodiments, the amount of $Y_2O_3$ in the glass composition is from 7.5 mol. % to 15 mol. %. In embodiments, the amount of $Y_2O_3$ in the glass composition is from 8 mol. % to 15 mol. %.

The glass composition may also include one or more alkaline earth oxides or ZnO. The sum of all alkaline earth oxides and ZnO (in mol. %) is expressed herein as R'O. Specifically, R'O is the sum of MgO (mol. %), CaO (mol. %), SrO (mol. %), BaO (mol. %), and ZnO (mol. %) present in the glass composition. Without intending to be bound by any particular theory, it is believed that the alkaline earth oxides and ZnO may be introduced in the glass composition to enhance various properties. For example, the addition of certain alkaline earth oxides or ZnO may increase the ion exchange stress but may decrease the alkali diffusivity. R'O may also aid in decreasing the liquidus temperature (hence raise the liquidus viscosity) at low concentrations. R'O may also aid in decreasing the softening point and molding temperature of the glass composition, thereby offsetting the increase in the softening point and molding temperature of the glass composition due to $SiO_2$ in the glass composition. Additions of certain alkaline earth oxides or ZnO may also aid in reducing the tendency of the glass to crystallize. In general, additions of alkaline earth oxide or ZnO do not increase the average coefficient of thermal expansion of a glass substrate made from the glass composition over the temperature range from 20° C. to 300° C. as much as alternative modifiers (e.g., alkali oxides). In addition, it has been found that relatively smaller alkaline earth oxides do not increase the average coefficient of thermal expansion of a glass substrate made from the glass composition over the temperature range from 20° C. to 300° C. as much as larger alkaline earth oxides. For example, MgO increases the average coefficient of thermal expansion less than BaO increases the average coefficient of thermal expansion.

In embodiments, the glass composition may be substantially free of R'O. In embodiments, the glass composition may be free of R'O. In embodiments of the glass composition including R'O, the R'O may be present in an amount greater than 0 mol. %, such as greater than or equal to 0.5 mol. %, and less than or equal to 5 mol. %. Without intending to be bound by any particular theory, it is believed that R'O decreases alkali diffusivity and slows ion exchange. Thus, the content of R'O can be minimized to prevent excessive ion exchange times for glass substrates with thicknesses greater than 0.5 mm. In embodiments including R'O, the lower bound of the amount of R'O in the glass composition may be greater than 0 mol. %, greater than or equal to 0.5 mol. %, greater than or equal to 1 mol. %, greater than or equal to 1.5 mol. %, greater or equal to 2 mol. %, or even greater than or equal to 2.5 mol. %. In such embodiments, the upper bound of the amount of R'O in the glass composition may be less than or equal to 5 mol. %, less than or equal to 4.5 mol. %, less than or equal to 4 mol. %, less than or equal to 3.5 mol. %, or even less than or equal to 3 mol. %. It should be understood that the amount of R'O in the glass composition may be within a range formed from any one of the lower bounds for R'O and any one of the upper bounds of R'O described herein.

For example and without limitation, the glass composition may include R'O in an amount from 0 mol. % to 5 mol. %. In embodiments, the glass composition may include from 0 mol. % to 4.5 mol. % R'O. In embodiments, the glass composition may include from 0 mol. % to 4 mol. % R'O. In embodiments, the glass composition may include from 0 mol. % to 3.5 mol. % R'O. In embodiments, the glass composition may include from 0 mol. % to 3 mol. % R'O. In embodiments, the glass composition may include from 0.5 mol. % to 5 mol. % R'O. In embodiments, the glass composition may include from 1 mol. % to 5 mol. % R'O. In embodiments, the glass composition may include from 1.5 mol. % to 5 mol. % R'O. In embodiments, the glass composition may include from 2 mol. % to 5 mol. % R'O. In embodiments, the glass composition may include from 2.5 mol. % to 5 mol. % R'O.

In embodiments of the glass compositions described herein, the R'O in the glass composition may optionally include MgO. Without intending to be bound by any particular theory, it is believed that in addition to improving the formability and the meltability of the glass composition, MgO may also increase the viscosity of the glass composition and reduce the tendency of the glass composition to crystallize. However, too much MgO tends to encourage crystallization in the glass, decreasing the liquidus viscosity and decreasing formability.

In embodiments, the glass composition may be substantially free of MgO. In embodiments, the glass composition may be free of MgO. In embodiments where the glass composition includes MgO, the MgO may be present in an amount greater than 0 mol. %, such as greater than or equal to 0.5 mol. %, and less than or equal to 5 mol. %. In embodiments including MgO, the lower bound of the amount of MgO in the glass composition may be greater than or equal to 0.25 mol. %, greater than or equal to 0.5 mol. %, greater than or equal to 0.75 mol. %, greater or equal to 1 mol. %, greater than or equal to 1.25 mol. %, greater than or equal to 1.5 mol. %, greater than or equal to 1.75 mol. %, greater or equal to 2 mol. %, greater or equal to 2.25 mol. %, or even greater than or equal to 2.5 mol. %. In such embodiments, the upper bound of the amount of MgO in the glass composition may be less than or equal to 5 mol. %, less than or equal to 4.75 mol. %, less than or equal to 4.5 mol. %, less than or equal to 4.25 mol. %, less than or equal to 4 mol. %, less than or equal to 3.75 mol. %, less than or equal to 3.5 mol. %, less than or equal to 3.25 mol. %, less than or equal to 3 mol. %, or even less than or equal to 2.75 mol. %. It should be understood that the amount of MgO in the glass composition may be within a range formed from any one of the lower bounds for MgO and any one of the upper bounds of MgO described herein.

For example and without limitation, the glass composition may include MgO in an amount from 0 mol. % to 5 mol. % MgO. In embodiments, the glass composition may include from 0 mol. % to 4.75 mol. % MgO. In embodiments, the glass composition may include from 0 mol. % to 4.5 mol. % MgO. In embodiments, the glass composition may include from 0 mol. % to 4.25 mol. % MgO. In embodiments, the glass composition may include from 0 mol. % to 4 mol. % MgO. In embodiments, the glass composition may include from 0 mol. % to 3.75 mol. % MgO. In embodiments, the glass composition may include from 0 mol. % to 3.5 mol. % MgO. In embodiments, the glass composition may include from 0 mol. % to 3.25 mol. % MgO. In embodiments, the glass composition may include from 0 mol. % to 3 mol. % MgO. In embodiments, the glass composition may include from 0 mol. % to 2.75 mol. % MgO. In embodiments, the glass composition may include from 0.25 mol. % to 5 mol. % MgO. In embodiments, the glass composition may include from 0.5 mol. % to 5 mol. % MgO. In embodiments, the glass composition may include from 0.75 mol. % to 5 mol. % MgO. In embodiments, the glass composition may include from 1 mol. % to 5 mol. % MgO. In embodiments, the glass composition may include from 1.25 mol. % to 5 mol. % MgO. In embodiments, the glass composition may include from 1.5 mol. % to 5 mol. % MgO. In embodiments, the glass composition may include from 1.75 mol. % to 5 mol. % MgO. In embodiments, the glass composition may include from 2 mol. % to 5 mol. % MgO. In embodiments, the glass composition may include from 2.25 mol. % to 5 mol. % MgO. In embodiments, the glass composition may include from 2.5 mol. % to 5 mol. % MgO. In embodiments, the glass composition may include from 2.5 mol. % to 3 mol. % MgO.

In embodiments of the glass composition described herein, the WO in the glass composition may optionally include CaO. Without intending to be bound by any particular theory, it is believed that in addition to improving the formability and the meltability of the glass composition, CaO may also lower the liquidus temperature in small amounts while improving chemical durability and lowering the CTE. If the CaO content is too high (or if the MgO+ CaO content is too high) then the liquidus temperature can increase (hence lowering the liquidus viscosity).

In embodiments, the glass composition may be substantially free of CaO. In embodiments, the glass composition may be free of CaO. In embodiments where the glass composition includes CaO, the CaO may be present in an amount greater than 0 mol. %, such as greater than or equal to 0.5 mol. %, and less than or equal to 2.5 mol. %. In embodiments including CaO, the lower bound of the amount of CaO in the glass composition may be greater than or equal to 0.25 mol. %, greater than or equal to 0.5 mol. %, greater than or equal to 0.75 mol. %, greater or equal to 1 mol. %, or even greater than or equal to 1.25 mol. %. In such embodiments, the upper bound of the amount of CaO in the glass composition may be less than or equal to 2.5 mol. %, less than or equal to 2.25 mol. %, less than or equal to 2 mol. %, less than or equal to 1.75 mol. %, or even less than or equal to 1.5 mol. %. It should be understood that the amount of CaO in the glass composition may be within a range formed from any one of the lower bounds for CaO and any one of the upper bounds of CaO described herein.

For example and without limitation, the glass composition may include CaO in an amount from 0 mol. % to 2.5 mol. % CaO. In embodiments, the glass composition may include from 0 mol. % to 2.25 mol. % CaO. In embodiments, the glass composition may include from 0 mol. % to 2 mol. % CaO. In embodiments, the glass composition may include from 0 mol. % to 1.75 mol. % CaO. In embodiments, the glass composition may include from 0 mol. % to 1.5 mol. % CaO. In embodiments, the glass composition may include from 0.25 mol. % to 2.5 mol. % CaO. In embodiments, the glass composition may include from 0.5 mol. % to 2.5 mol. % CaO. In embodiments, the glass composition may include from 0.75 mol. % to 2.5 mol. % CaO. In embodiments, the glass composition may include from 1 mol. % to 2.5 mol. % CaO. In embodiments, the glass composition may include from 1.25 mol. % to 2.5 mol. % CaO.

In the embodiments described herein, the WO in the glass composition may optionally include SrO. Without intending to be bound by any particular theory, it is believed that in addition to improving the formability and the meltability of the glass composition, SrO may also reduce the tendency of the glass to crystallize. However, too much SrO may lower the liquidus viscosity and may increase the CTE.

In embodiments, the glass composition may be substantially free of SrO. In embodiments, the glass composition may be free of SrO. In embodiments where the glass composition includes SrO, the SrO may be present in an amount greater than 0 mol. %, such as greater than or equal to 0.5 mol. %, and less than or equal to 5 mol. %. In embodiments including SrO, the lower bound of the amount of SrO in the glass composition may be greater than or equal to 0.25 mol. %, greater than or equal to 0.5 mol. %, greater than or equal to 0.75 mol. %, greater or equal to 1 mol. %, greater than or equal to 1.25 mol. %, greater than or equal to 1.5 mol. %, greater than or equal to 1.75 mol. %, greater or equal to 2.0 mol. %, greater or equal to 2.25 mol. %, or even greater than or equal to 2.5 mol. %. In such embodiments, the upper bound of the amount of SrO in the glass composition may be less than or equal to 5 mol. %, less than or equal to 4.75 mol. %, less than or equal to 4.5 mol. %, less than or equal to 4.25 mol. %, less than or equal to 4 mol. %, less than or equal to 3.75 mol. %, less than or equal to 3.5 mol. %, less than or equal to 3.25 mol. %, less than or equal to 3 mol. %, or even less than or equal to 2.75 mol. %. It should be understood that the amount of SrO in the glass composition may be within a range formed from any one of the lower bounds for SrO and any one of the upper bounds of SrO described herein.

For example and without limitation, the glass composition may include SrO in an amount from 0 mol. % to 5 mol. %. In embodiments, the glass composition may include from 0 mol. % to 4.75 mol. % SrO. In embodiments, the glass composition may include from 0 mol. % to 4.5 mol. % SrO. In embodiments, the glass composition may include from 0 mol. % to 4.25 mol. % SrO. In embodiments, the glass composition may include from 0 mol. % to 4 mol. % SrO. In embodiments, the glass composition may include from 0 mol. % to 3.75 mol. % SrO. In embodiments, the glass composition may include from 0 mol. % to 3.5 mol. % SrO.

In embodiments, the glass composition may include from 0 mol. % to 3.25 mol. % SrO. In embodiments, the glass composition may include from 0 mol. % to 3 mol. % SrO. In embodiments, the glass composition may include from 0 mol. % to 2.75 mol. % SrO. In embodiments, the glass composition may include from 0.25 mol. % to 5 mol. % SrO. In embodiments, the glass composition may include from 0.5 mol. % to 5 mol. % SrO. In embodiments, the glass composition may include from 0.75 mol. % to 5 mol. % SrO. In embodiments, the glass composition may include from 1 mol. % to 5 mol. % SrO. In embodiments, the glass composition may include from 1.25 mol. % to 5 mol. % SrO. In embodiments, the glass composition may include from 1.5 mol. % to 5 mol. % SrO. In embodiments, the glass composition may include from 1.75 mol. % to 5 mol. % SrO. In embodiments, the glass composition may include from 2 mol. % to 5 mol. % SrO. In embodiments, the glass composition may include from 2.25 mol. % to 5 mol. % SrO. In embodiments, the glass composition may include from 2.5 mol. % to 5 mol. % SrO. In embodiments, the glass composition may include from 0.5 mol. % to 2.5 mol. % SrO.

In the embodiments described herein, the WO in the glass composition may optionally include BaO. Without intending to be bound by any particular theory, it is believed that in addition to improving the formability and the meltability of the glass composition, BaO may also reduce the tendency of the glass to crystallize. However, too much BaO may decrease the liquidus viscosity and may increase the CTE.

In embodiments, the glass composition may be substantially free of BaO. In embodiments, the glass composition may be free of BaO. In embodiments where the glass composition includes BaO, the BaO may be present in an amount greater than 0 mol. %, such as greater than or equal to 0.5 mol. %, and less than or equal to 5 mol. %. In embodiments including BaO, the lower bound of the amount of BaO in the glass composition may be greater than or equal to 0.25 mol. %, greater than or equal to 0.5 mol. %, greater than or equal to 0.75 mol. %, greater or equal to 1 mol. %, greater than or equal to 1.25 mol. %, greater than or equal to 1.5 mol. %, greater than or equal to 1.75 mol. %, greater or equal to 2.0 mol. %, greater or equal to 2.25 mol. %, or even greater than or equal to 2.5 mol. %. In such embodiments, the upper bound of the amount of BaO in the glass composition may be less than or equal to 5 mol. %, less than or equal to 4.75 mol. %, less than or equal to 4.5 mol. %, less than or equal to 4.25 mol. %, less than or equal to 4 mol. %, less than or equal to 3.75 mol. %, less than or equal to 3.5 mol. %, less than or equal to 3.25 mol. %, less than or equal to 3 mol. %, or even less than or equal to 2.75 mol. %. It should be understood that the amount of BaO in the glass composition may be within a range formed from any one of the lower bounds for BaO and any one of the upper bounds of BaO described herein.

For example and without limitation, the glass composition may include BaO in an amount from 0 mol. % to 5 mol. %. In embodiments, the glass composition may include from 0 mol. % to 4.75 mol. % BaO. In embodiments, the glass composition may include from 0 mol. % to 4.5 mol. % BaO. In embodiments, the glass composition may include from 0 mol. % to 4.25 mol. % BaO. In embodiments, the glass composition may include from 0 mol. % to 4 mol. % BaO. In embodiments, the glass composition may include from 0 mol. % to 3.75 mol. % BaO. In embodiments, the glass composition may include from 0 mol. % to 3.5 mol. % BaO. In embodiments, the glass composition may include from 0 mol. % to 3.25 mol. % BaO. In embodiments, the glass composition may include from 0 mol. % to 3 mol. % BaO. In embodiments, the glass composition may include from 0 mol. % to 2.75 mol. % BaO. In embodiments, the glass composition may include from 0.25 mol. % to 5 mol. % BaO. In embodiments, the glass composition may include from 0.5 mol. % to 5 mol. % BaO. In embodiments, the glass composition may include from 0.75 mol. % to 5 mol. % BaO. In embodiments, the glass composition may include from 1 mol. % to 5 mol. % BaO. In embodiments, the glass composition may include from 1.25 mol. % to 5 mol. % BaO. In embodiments, the glass composition may include from 1.5 mol. % to 5 mol. % BaO. In embodiments, the glass composition may include from 1.75 mol. % to 5 mol. % BaO. In embodiments, the glass composition may include from 2 mol. % to 5 mol. % BaO. In embodiments, the glass composition may include from 2.25 mol. % to 5 mol. % BaO. In embodiments, the glass composition may include from 2.5 mol. % to 5 mol. % BaO. In embodiments, the glass composition may include from 0.5 mol. % to 2.5 mol. % BaO.

The glass composition may further include ZnO as a modifier of the glass composition. Without intending to be bound by any particular theory, it is believed that additions of ZnO to the glass composition decrease the softening point and molding temperature of the glass composition, thereby offsetting the increase in the softening point and molding temperature of the glass composition due to $SiO_2$ in the glass composition. ZnO may also increase the stress after ion exchange, but decrease the diffusivity of alkali ions and slow ion exchange. Significantly, additions of ZnO do not increase the average coefficient of thermal expansion of a glass substrate made from the glass composition over the temperature range from 20° C. to 300° C. as much as some other modifiers (e.g., alkali oxides and/or the alkaline earth oxides CaO and SrO). As such, the benefit of using additions of ZnO to reduce the softening point and molding temperature can be maximized without a significant increase in the average coefficient of thermal expansion. In this regard, ZnO has a similar effect on the glass composition as MgO (e.g., it reduces the softening point and molding temperature of the glass composition without significantly increasing the average coefficient of thermal expansion). However, additions of ZnO to achieve these characteristics are favored over additions of MgO because ZnO has a more pronounced effect on the softening point and ZnO does not promote nucleation and crystallization in the glass as much as MgO.

In embodiments, the glass composition may be substantially free of ZnO. In embodiments, the glass composition may be free of ZnO. If the concentration of ZnO is too high the liquidus temperature may increase and the rate of ion exchange may decrease. In embodiments where the glass composition includes ZnO, the ZnO may be present in an amount greater than 0 mol. %, such as greater than or equal to 0.5 mol. %, and less than or equal to 4 mol. %. In embodiments including ZnO, the lower bound of the amount of ZnO in the glass composition may be greater than or equal to 0.25 mol. %, greater than or equal to 0.5 mol. %, greater than or equal to 0.75 mol. %, greater or equal to 1 mol. %, greater than or equal to 1.25 mol. %, greater than or equal to 1.5 mol. %, greater than or equal to 1.75 mol. %, greater or equal to 2.0 mol. %, greater or equal to 2.25 mol. %, or even greater than or equal to 2.5 mol. %. In such embodiments, the upper bound of the amount of ZnO in the glass composition may be less than or equal to 4 mol. %, less than or equal to 3.75 mol. %, less than or equal to 3.5 mol. %, less than or equal to 3.25 mol. %, less than or equal to 3 mol. %, or even less than or equal to 2.75 mol. %. It should be understood that the amount of ZnO in the glass composition may be within a range formed from any one of the lower bounds for ZnO and any one of the upper bounds of ZnO described herein.

For example and without limitation, the glass composition may include ZnO in an amount from 0.5 mol. % to 4 mol. %. In embodiments, the glass composition may include from 0.5 mol. % to 3.75 mol. % ZnO. In embodiments, the glass composition may include from 0.5 mol. % to 3.5 mol. % ZnO. In embodiments, the glass composition may include from 0.5 mol. % to 3.25 mol. % ZnO. In embodiments, the glass composition may include from 0.5 mol. % to 3 mol. % ZnO. In embodiments, the glass composition may include from 0.5 mol. % to 2.75 mol. % ZnO. In embodiments, the glass composition may include from 0.75 mol. % to 4 mol. % ZnO. In embodiments, the glass composition may include from 1.0 mol. % to 4 mol. % ZnO. In embodiments, the glass composition may include from 1.25 mol. % to 4 mol. % ZnO. In embodiments, the glass composition may include from 1.5 mol. % to 4 mol. % ZnO. In embodiments, the glass composition may include from 1.75 mol. % to 4 mol. % ZnO. In embodiments, the glass composition may include from 2 mol. % to 4 mol. % ZnO. In embodiments, the glass composition may include from 2.25 mol. % to 4 mol. % ZnO. In embodiments, the glass composition may include from 2.5 mol. % to 4 mol. % ZnO. In embodiments, the glass composition may include from 0.5 mol. % to 2.5 mol. % ZnO.

In one or more embodiments, the glass composition include $Al_2O_3$. $Al_2O_3$ may act as both a conditional network former and a modifier. While not intending to be bound by any particular theory, it is believed that $Al_2O_3$ binds the alkali oxides in the glass network, increasing the viscosity of the glass composition. $Al_2O_3$ may enhance alkali diffusivity, $E_{mod}$, and $K_{1C}$. The ion exchange rate and maximum ion exchange stress may be maximized when the $Al_2O_3$ content is close to the total alkali oxide content. It is also believed that $Al_2O_3$ may contribute to a stable glass article with low CTE and improved rigidity. However, excessive additions of $Al_2O_3$ to the glass composition may also increase the softening point and raise the liquidus temperature (hence lower the liquidus viscosity), which may adversely impact the formability of the glass composition.

In embodiments, the glass compositions may include $Al_2O_3$ in an amount greater than or equal to 3.5 mol. %. The amount of $Al_2O_3$ may be less than or equal to 22 mol. %. If the $Al_2O_3$ content is too low, ion exchange stress, viscosity, and fracture toughness may all be too low. However, if the $Al_2O_3$ content is too high, the liquidus temperature may be too high and the glass may crystallize. Accordingly, in embodiments, the glass composition may comprise $Al_2O_3$ in an amount from 3.5 mol. % to 22 mol. %. In embodiments, the lower bound of the amount of $Al_2O_3$ in the glass composition may be greater than or equal to 3.5 mol. %, greater than or equal to 4 mol. %, greater than or equal to 5 mol. %, greater than or equal to 6 mol. %, greater than or equal to 7 mol. %, greater than or equal to 8 mol. %, greater than or equal to 9 mol. %, greater than or equal to 10 mol. %, greater than or equal to 11 mol. %, or even greater than or equal to 12 mol. %. In embodiments, the upper bound of the amount of $Al_2O_3$ in the glass composition may be less than or equal to 22 mol. %, less than or equal to 21 mol. %, less than or equal to 20 mol. %, less than or equal to 19 mol. %, less than or equal to 18 mol. %, less than or equal to 17 mol. %, less than or equal to 16 mol. %, less than or equal to 15 mol. %, less than or equal to 14 mol. %, or even less than or equal to 13 mol. %. It should be understood that the amount of $Al_2O_3$ in the glass composition may be within a range formed from any one of the lower bounds for $Al_2O_3$ and any one of the upper bounds of $Al_2O_3$ described herein.

For example and without limitation, the glass composition may include $Al_2O_3$ in an amount from 3.5 mol. % to 22 mol. %. In embodiments, the amount of $Al_2O_3$ in the glass composition is from 3.5 mol. % to 21 mol. %. In embodiments, the amount of $Al_2O_3$ in the glass composition is from 3.5 mol. % to 20 mol. %. In embodiments, the amount of $Al_2O_3$ in the glass composition is from 3.5 mol. % to 19 mol. %. In embodiments, the amount of $Al_2O_3$ in the glass composition is from 3.5 mol. % to 18 mol. %. In embodiments, the amount of $Al_2O_3$ in the glass composition is from 3.5 mol. % to 17 mol. %. In embodiments, the amount of $Al_2O_3$ in the glass composition is from 3.5 mol. % to 16 mol. %. In embodiments, the amount of $Al_2O_3$ in the glass composition is from 3.5 mol. % to 15 mol. %. In embodiments, the amount of $Al_2O_3$ in the glass composition is from 3.5 mol. % to 14 mol. %. In embodiments, the amount of $Al_2O_3$ in the glass composition is from 3.5 mol. % to 13 mol. %. In embodiments, the amount of $Al_2O_3$ in the glass composition is from 4 mol. % to 22 mol. %. In embodiments, the amount of $Al_2O_3$ in the glass composition is from 5 mol. % to 22 mol. %. In embodiments, the amount of $Al_2O_3$ in the glass composition is from 6 mol. % to 22 mol. %. In embodiments, the amount of $Al_2O_3$ in the glass composition is from 7 mol. % to 22 mol. %. In embodiments, the amount of $Al_2O_3$ in the glass composition is from 8 mol. % to 22 mol. %. In embodiments, the amount of $Al_2O_3$ in the glass composition is from 9 mol. % to 22 mol. %. In embodiments, the amount of $Al_2O_3$ in the glass composition is from 10 mol. % to 22 mol. %. In embodiments, the amount of $Al_2O_3$ in the glass composition is from 11 mol. % to 22 mol. %. In embodiments, the amount of $Al_2O_3$ in the glass composition is from 12 mol. % to 22 mol. %.

Boron oxide ($B_2O_3$) is a glass former which may be added to the glass composition to reduce the viscosity of the glass composition at a given temperature thereby improving the formability of the glass composition. Said differently, additions of $B_2O_3$ to the glass composition decrease the strain, anneal, softening, and molding temperatures of the glass composition, thereby improving the formability of the glass composition. As such, additions of $B_2O_3$ may be used to offset the decrease in formability of glass composition having relatively higher amounts of $SiO_2$. $B_2O_3$ also helps to lower the liquidus temperature and suppress crystallization. However, it has been found that if the amount of $B_2O_3$ in the glass composition is too high, the diffusivity of alkali ions into a glass substrate made from the glass composition is low, the rate of ion exchange is decreased, and the stress achieved after ion exchange is decreased.

In embodiments, the glass composition may be free of $B_2O_3$. In other embodiments, the glass composition may be substantially free of $B_2O_3$. In other embodiments, the glass composition may include $B_2O_3$ in a concentration greater than 0 mol. % to enhance the formability of the glass composition, when present. The concentration of $B_2O_3$ may be less than or equal to 11 mol. % such that reasonable ion exchange times and satisfactory stress can be achieved after ion exchange. Accordingly, in the embodiments in which $B_2O_3$ is present, the glass composition generally comprises $B_2O_3$ in an amount from 0 mol. % to 11 mol. %. In such embodiments, the lower bound of the amount of $B_2O_3$ in the glass composition may be greater than 0 mol. %, greater than or equal to 0.5 mol. %, greater than or equal to 1 mol. %, greater than or equal to 1.5 mol. %, greater than or equal to 2 mol. %, greater than or equal to 2.5 mol. %, greater than or equal to 3 mol. %, greater than or equal to 3.5 mol. %, greater than or equal to 4 mol. %, greater than or equal to 4.5 mol. %, greater than or equal to 5 mol. %, or even greater than or equal to 5.5 mol. %. In embodiments, the upper bound of the amount of $B_2O_3$ in the glass composition may be less than or equal to 11 mol. %, less than or equal to 10.5 mol. %, less than or equal to 10 mol. %, less than or equal to 9.5 mol. %, less than or equal to 9 mol. %, less than or equal to 8.5 mol. %, less than or equal to 8 mol. %, less than or equal to 7.5 mol. %, less than or equal to 7 mol. %, less than or equal to 6.5 mol. %, or even less than or equal to 6 mol. %. It should be understood that the amount of $B_2O_3$ in the glass composition may be within a range formed from any one of the lower bounds for $B_2O_3$ and any one of the upper bounds of $B_2O_3$ described herein.

For example and without limitation, the glass composition may include $B_2O_3$ in an amount from 0 mol. % to 11 mol. %. In embodiments, the amount of $B_2O_3$ in the glass composition is from 0.5 mol. % to 11 mol. %. In embodiments, the amount of $B_2O_3$ in the glass composition is from 1 mol. % to 11 mol. %. In embodiments, the amount of $B_2O_3$ in the glass composition is from 1.5 mol. % to 11 mol. %. In embodiments, the amount of $B_2O_3$ in the glass composition is from 2 mol. % to 11 mol. %. In embodiments, the amount of $B_2O_3$ in the glass composition is from 2.5 mol. % to 11 mol. %. In embodiments, the amount of $B_2O_3$ in the glass composition is from 3 mol. % to 11 mol. %. In embodiments, the amount of $B_2O_3$ in the glass composition is from 3.5 mol. % to 11 mol. %. In embodiments, the amount of $B_2O_3$ in the glass composition is from 4 mol. % to 11 mol. %. In embodiments, the amount of $B_2O_3$ in the glass composition is from 4.5 mol. % to 11 mol. %. In embodiments, the amount of $B_2O_3$ in the glass composition is from 5 mol. % to 11 mol. %. In embodiments, the amount of $B_2O_3$ in the glass composition is from 5.5 mol. % to 11 mol. %. In embodiments, the amount of $B_2O_3$ in the glass composition is from 0 mol. % to 10.5 mol. %. In embodiments, the amount of $B_2O_3$ in the glass composition is from 0 mol. % to 10 mol. %. In embodiments, the amount of $B_2O_3$ in the glass composition is from 0 mol. % to 9.5 mol. %. In embodiments, the amount of $B_2O_3$ in the glass composition is from 0 mol. % to 9 mol. %. In embodiments, the amount of $B_2O_3$ in the glass composition is from 0 mol. % to 8.5 mol. %. In embodiments, the amount of $B_2O_3$ in the glass composition is from 0 mol. % to 8 mol. %. In embodiments, the amount of $B_2O_3$ in the glass composition is from 0 mol. % to 7.5 mol. %. In embodiments, the amount of $B_2O_3$ in the glass composition is from 0 mol. % to 7 mol. %. In embodiments, the amount of $B_2O_3$ in the glass composition is from 0 mol. % to 6.5 mol. %. In embodiments, the amount of $B_2O_3$ in the glass composition is from 0 mol. % to 6 mol. %.

The glass composition may also include $P_2O_5$. Without intending to be bound by any particular theory, it is believed that $P_2O_5$ improves damage resistance and increases the rate of ion exchange. $P_2O_5$ may lower the liquidus temperature, which improves the liquidus viscosity. In some embodiments, the addition of phosphorous to the glass creates a structure in which $SiO_2$ is replaced by tetrahedrally coordinated aluminum and phosphorus ($AlPO_4$) as a glass former.

In embodiments, the glass composition may be free of $P_2O_5$. In other embodiments, the glass composition may be substantially free of $P_2O_5$. In other embodiments, the glass composition may include $P_2O_5$ in a concentration of greater than 0 mol. %. The glass composition may include $P_2O_5$ in a concentration less than or equal to 3 mol. %, because if the $P_2O_5$ content is too high, the fracture toughness and stress achieved with ion exchange may be decreased. Accordingly, in the embodiments in which $P_2O_5$ is present, the glass composition generally comprises $P_2O_5$ in an amount from 0 mol. % to 3 mol. %. In such embodiments, the lower bound of the amount of $P_2O_5$ in the glass composition may be greater than 0 mol. %, greater than or equal to 0.25 mol. %, greater than or equal to 0.5 mol. %, greater than or equal to 0.75 mol. %, greater than or equal to 1 mol. %, greater than or equal to 1.25 mol. %, or even greater than or equal to 1.5 mol. %. In embodiments, the upper bound of the amount of $P_2O_5$ in the glass composition may be less than or equal to 3 mol. %, less than or equal to 2.75 mol. %, less than or equal to 2.5 mol. %, less than or equal to 2.25 mol. %, less than or equal to 2 mol. %, or even less than or equal to 1.75 mol. %. It should be understood that the amount of $P_2O_5$ in the glass composition may be within a range formed from any one of the lower bounds for $P_2O_5$ and any one of the upper bounds of $P_2O_5$ described herein.

For example and without limitation, the glass composition including $P_2O_5$ may include $P_2O_5$ in an amount from 0 mol. % to 3 mol. %. In embodiments, the amount of $P_2O_5$ in the glass composition is from 0.25 mol. % to 3 mol. %. In embodiments, the amount of $P_2O_5$ in the glass composition is from 0.5 mol. % to 3 mol. %. In embodiments, the amount of $P_2O_5$ in the glass composition is from 0.75 mol. % to 3 mol. %. In embodiments, the amount of $P_2O_5$ in the glass composition is from 1 mol. % to 3 mol. %. In embodiments, the amount of $P_2O_5$ in the glass composition is from 1.25 mol. % to 3 mol. %. In embodiments, the amount of $P_2O_5$ in the glass composition is from 1.5 mol. % to 3 mol. %. In embodiments, the amount of $P_2O_5$ in the glass composition is from 0 mol. % to 2.75 mol. %. In embodiments, the amount of $P_2O_5$ in the glass composition is from 0 mol. % to 2.5 mol. %. In embodiments, the amount of $P_2O_5$ in the glass composition is from 0 mol. % to 2.25 mol. %. In embodiments, the amount of $P_2O_5$ in the glass composition is from 0 mol. % to 2 mol. %. In embodiments, the amount of $P_2O_5$ in the glass composition is from 0 mol. % to 1.75 mol. %.

In embodiments, the glass composition may be substantially free of other constituent components including, without limitation, $Fe_2O_3$ and $SnO_2$. In embodiments, the glass composition may include small quantities of other constituent components including, without limitation, $Fe_2O_3$ and $SnO_2$. For example, the glass composition including $SnO_2$ may include greater than 0 mol. % to 0.2 mol. % $SnO_2$. In the same or different embodiments, the glass composition including $Fe_2O_3$ may include greater than 0 mol. % to 0.1 mol. % $Fe_2O_3$. $Fe_2O_3$ and $SnO_2$ can act as fining agents and help remove bubbles during melting and fining of the glass composition. Thus it may be beneficial to have one or more multivalent fining agents such as $Fe_2O_3$, $SnO_2$, $CeO_2$, or $MnO_2$ in the glass composition. In embodiments, $SnO_2$ may be used as a fining agent, and it may not impart any color to the glass. In embodiments, the glass composition may include greater than or equal to 0.05 mol. % and less than or equal to 0.15 mol. % $SnO_2$.

In some embodiments, the glass composition may include various compositional relationships. For example, $B_2O_3 + Na_2O$ may be from 2 mol. % to 13 mol. %. Without intending to be bound by any particular theory, it is believed that $B_2O_3$ and $Na_2O$ reduce the Young's modulus and hardness of the glass when compared to other oxides included in the glass. In particular, it is believed that $Na_2O$ reduces the Young's modulus and hardness of the glass due to the low ionic field strength of $Na+$ ions while $B_2O_3$ reduces the Young's modulus and hardness of the glass when boron is present in the glass in a trigonally coordinated state. In embodiments, the lower bound of $B_2O_3+Na_2O$ may be greater than 2 mol. %, greater than or equal to 2.5 mol. %, greater than or equal to 3 mol. %, greater than or equal to 3.5 mol. %, greater than or equal to 4 mol. %, greater than or equal to 4.5 mol. %, greater than or equal to 5 mol. %, greater than or equal to 5.5 mol. %, greater than or equal to 6 mol. %, greater than or equal to 6.5 mol. %, greater than or equal to 7 mol. %, or even greater than or equal to 7.5 mol. %. In embodiments, the upper bound of $B_2O_3+Na_2O$ may be less than or equal to 13 mol. %, less than or equal to 12.5 mol. %, less than or equal to 12 mol. %, less than or equal to 11.5 mol. %, less than or equal to 11 mol. %, less than or equal to 10.5 mol. %, less than or equal to 10 mol. %, less than or equal to 9.5 mol. %, less than or equal to 9 mol. %, less than or equal to 8.5 mol. %, or even less than or equal to 8 mol. %. It should be understood that $B_2O_3+Na_2O$ may be within a range formed from any one of the lower bounds for $B_2O_3+Na_2O$ and any one of the upper bounds of $B_2O_3+Na_2O$ described herein.

For example and without limitation, $B_2O_3+Na_2O$ may range from 2 mol. % to 13 mol. %. In embodiments, $B_2O_3+Na_2O$ may range from 2.5 mol. % to 13 mol. %. In embodiments, $B_2O_3+Na_2O$ may range from 3 mol. % to 13 mol. %. In embodiments, $B_2O_3+Na_2O$ may range from 3.5 mol. % to 13 mol. %. In embodiments, $B_2O_3+Na_2O$ may range from 4 mol. % to 13 mol. %. In embodiments, $B_2O_3+Na_2O$ may range from 4.5 mol. % to 13 mol. %. In embodiments, $B_2O_3+Na_2O$ may range from 5 mol. % to 13 mol. %. In embodiments, $B_2O_3+Na_2O$ may range from 5.5 mol. % to 13 mol. %. In embodiments, $B_2O_3+Na_2O$ may range from 6 mol. % to 13 mol. %. In embodiments, $B_2O_3+Na_2O$ may range from 6.5 mol. % to 13 mol. %. In embodiments, $B_2O_3+Na_2O$ may range from 7 mol. % to 13 mol. %. In embodiments, $B_2O_3+Na_2O$ may range from 7.5 mol. % to 13 mol. %. In embodiments, $B_2O_3+Na_2O$ may range from 2 mol. % to 12.5 mol. %. In embodiments, $B_2O_3+Na_2O$ may range from 2 mol. % to 12 mol. %. In embodiments, $B_2O_3+Na_2O$ may range from 2 mol. % to 11.5 mol. %. In embodiments, $B_2O_3+Na_2O$ may range from 2 mol. % to 11 mol. %. In embodiments, $B_2O_3+Na_2O$ may range from 2 mol. % to 10.5 mol. %. In embodiments, $B_2O_3+Na_2O$ may range from 2 mol. % to 10 mol. %. In embodiments, $B_2O_3+Na_2O$ may range from 2 mol. % to 9.5 mol. %. In embodiments, $B_2O_3+Na_2O$ may range from 2 mol. % to 9 mol. %. In embodiments, $B_2O_3+Na_2O$ may range from 2 mol. % to 8.5 mol. %. In embodiments, $B_2O_3+Na_2O$ may range from 2 mol. % to 8 mol. %.

As a further example, $Y_2O_3+Al_2O_3$ may be from 10 mol. % to 24 mol. %. Without intending to be bound by any particular theory, it is believed that $Y_2O_3+Al_2O_3$ may help increase the Young's modulus, hardness, and fracture toughness when compared to other oxides in the glass. Again without intending to be bound by any particular theory, it is believed that when the sum of $Y_2O_3+Al_2O_3$ exceeds 24 mol. %, the meltability of the glass may be decreased, and when the sum of $Y_2O_3+Al_2O_3$ is less than 10 mol. %, the Young's modulus, hardness, and fracture toughness of the glass may diminish. In embodiments, the lower bound of $Y_2O_3+Al_2O_3$ may be greater than 10 mol. %, greater than or equal to 10.5 mol. %, greater than or equal to 11 mol. %, greater than or equal to 11.5 mol. %, greater than or equal to 12 mol. %, greater than or equal to 12.5 mol. %, greater than or equal to 13 mol. %, greater than or equal to 13.5 mol. %, greater than or equal to 14 mol. %, greater than or equal to 14.5 mol. %, greater than or equal to 15 mol. %, greater than or equal to 15.5 mol. %, greater than or equal to 16 mol. %, greater than or equal to 16.5 mol. %, greater than or equal to 17 mol. %, or even greater than or equal to 17.5 mol. %. In embodiments, the upper bound of $Y_2O_3+Al_2O_3$ may be less than or equal to 24 mol. %, less than or equal to 23.5 mol. %, less than or equal to 23 mol. %, less than or equal to 22.5 mol. %, less than or equal to 22 mol. %, less than or equal to 21.5 mol. %, less than or equal to 21 mol. %, less than or equal to 20.5 mol. %, less than or equal to 20 mol. %, less than or equal to 19.5 mol. %, less than or equal to 19 mol. %, less than or equal to 18.5 mol. %, or even less than or equal to 18 mol. %. It should be understood that $Y_2O_3+Al_2O_3$ may be within a range formed from any one of the lower bounds for $Y_2O_3+Al_2O_3$ and any one of the upper bounds of $Y_2O_3+Al_2O_3$ described herein.

For example and without limitation, $Y_2O_3+Al_2O_3$ may range from 10 mol. % to 24 mol. %. In embodiments, $Y_2O_3+Al_2O_3$ may range from 10.5 mol. % to 24 mol. %. In embodiments, $Y_2O_3+Al_2O_3$ may range from 11 mol. % to 24 mol. %. In embodiments, $Y_2O_3+Al_2O_3$ may range from 11.5 mol. % to 24 mol. %. In embodiments, $Y_2O_3+Al_2O_3$ may range from 12 mol. % to 24 mol. %. In embodiments, $Y_2O_3+Al_2O_3$ may range from 12.5 mol. % to 24 mol. %. In embodiments, $Y_2O_3+Al_2O_3$ may range from 13 mol. % to 24 mol. %. In embodiments, $Y_2O_3+Al_2O_3$ may range from 13.5 mol. % to 24 mol. %. In embodiments, $Y_2O_3+Al_2O_3$ may range from 14 mol. % to 24 mol. %. In embodiments, $Y_2O_3+Al_2O_3$ may range from 14.5 mol. % to 24 mol. %. In embodiments, $Y_2O_3+Al_2O_3$ may range from 15 mol. % to 24 mol. %. In embodiments, $Y_2O_3+Al_2O_3$ may range from 15.5 mol. % to 24 mol. %. In embodiments, $Y_2O_3+Al_2O_3$ may range from 16 mol. % to 24 mol. %. In embodiments, $Y_2O_3+Al_2O_3$ may range from 16.5 mol. % to 24 mol. %. In embodiments, $Y_2O_3+Al_2O_3$ may range from 17 mol. % to 24 mol. %. In embodiments, $Y_2O_3+Al_2O_3$ may range from 17.5 mol. % to 24 mol. %. In embodiments, $Y_2O_3+Al_2O_3$ may range from 10 mol. % to 23.5 mol. %. In embodiments, $Y_2O_3+Al_2O_3$ may range from 10 mol. % to 23 mol. %. In embodiments, $Y_2O_3+Al_2O_3$ may range from 10 mol. % to 22.5 mol. %. In embodiments, $Y_2O_3+Al_2O_3$ may range from 10 mol. % to 22 mol. %. In embodiments, $Y_2O_3+Al_2O_3$ may range from 10 mol. % to 21.5 mol. %. In embodiments, $Y_2O_3+Al_2O_3$ may range from 10 mol. % to 21 mol. %. In embodiments, $Y_2O_3+Al_2O_3$ may range from 10 mol. % to 20.5 mol. %. In embodiments, $Y_2O_3+Al_2O_3$ may range from 10 mol. % to 20 mol. %. In embodiments, $Y_2O_3+Al_2O_3$ may range from 10 mol. % to 19.5 mol. %. In embodiments, $Y_2O_3+Al_2O_3$ may range from 10 mol. % to 19 mol. %. In embodiments, $Y_2O_3+Al_2O_3$ may range from 10 mol. % to 18.5 mol. %. In embodiments, $Y_2O_3+Al_2O_3$ may range from 10 mol. % to 18 mol. %.

As a further example, the ratio $R_2O/Al_2O_3$ may be from 0.5 to 4. Without intending to be bound by any particular theory, it is believed that the ratio $R_2O/Al_2O_3$ may have an impact on the rate of interdiffusion of ions in the glass. When the ratio is greater than 1 (such as greater than 4, for example), alkali associated with the $R_2O$ in excess of $Al_2O_3$ may have reduced rates of interdiffusion in the glass network. At a ratio of 1:1, the alkali ions may all theoretically be in a charge compensating role, and the resulting combination of the high free volume of the glass network and reduced alkali bond strength in the glass network is more favorable for ionic mobility and interdiffusion. At a ratio of less than 1 (such as less than 0.5, for example), the Al+ ions associated with $Al_2O_3$ in excess of $R_2O$ may become more highly coordinated, potentially resulting in a reduced free volume of the glass network and potentially having a negative impact on alkali interdiffusion. In embodiments, the lower bound of $R_2O/Al_2O_3$ may be greater than 0.5, greater than or equal to 0.75, greater than or equal to 1, greater than or equal to 1.25, greater than or equal to 1.5, greater than or equal to 1.75, greater than or equal to 2, or even greater than or equal to 2.25. In embodiments, the upper bound of $R_2O/Al_2O_3$ may be less than or equal to 4, less than or equal to 3.75, less than or equal to 3.5, less than or equal to 3.25, less than or equal to 3, less than or equal to 2.75, or even less than or equal to 2.5. It should be understood that $R_2O/Al_2O_3$ may be within a range formed from any one of the lower bounds for $R_2O/Al_2O_3$ and any one of the upper bounds of $R_2O/Al_2O_3$ described herein.

For example and without limitation, $R_2O/Al_2O_3$ may range from 0.5 to 4. In embodiments, $R_2O/Al_2O_3$ may range from 0.75 to 4. In embodiments, $R_2O/Al_2O_3$ may range from 1 to 4. In embodiments, $R_2O/Al_2O_3$ may range from 1.25 to 4. In embodiments, $R_2O/Al_2O_3$ may range from 1.5 to 4. In embodiments, $R_2O/Al_2O_3$ may range from 1.75 to 4. In embodiments, $R_2O/Al_2O_3$ may range from 2 to 4. In embodiments, $R_2O/Al_2O_3$ may range from 2.25 to 4. In embodiments, $R_2O/Al_2O_3$ may range from 0.5 to 3.75. In embodiments, $R_2O/Al_2O_3$ may range from 0.5 to 3.5. In embodiments, $R_2O/Al_2O_3$ may range from 0.5 to 3.25. In embodiments, $R_2O/Al_2O_3$ may range from 0.5 to 3. In embodiments, $R_2O/Al_2O_3$ may range from 0.5 to 2.75. In embodiments, $R_2O/Al_2O_3$ may range from 0.5 to 2.5.

As a further example, the ratio $(R_2O+RO)/Al_2O_3$ may be from 0.5 to 4.5. Without intending to be bound by any particular theory, it is believed that this ratio may have an impact on the rate of interdiffusion of ions. When the ratio $(R_2O+RO)/Al_2O_3$ is greater than 1 (such as greater than 4.5, for example), the glass may form non-bridging oxygens that reduce the free volume of the glass network and have a negative impact on alkali interdiffusion. At a ratio of 1:1, the alkali ions may theoretically all be in a charge compensating role, and the resulting combination of the high free volume of the glass network and reduced alkali bond strength in the glass network may be more favorable for ionic mobility. At a ratio of less than 1 (such as less than 0.5, for example), the Al+ ions associated with $Al_2O_3$ in excess of $R_2O+RO$ may become more highly coordinated, possibly resulting in a reduced free volume of the glass network and potentially having a negative impact on alkali interdiffusion. In embodiments, the lower bound of $(R_2O+RO)/Al_2O_3$ may be greater than 0.5, greater than or equal to 0.75, greater than or equal to 1, greater than or equal to 1.25, greater than or equal to 1.5, greater than or equal to 1.75, greater than or equal to 2, greater than or equal to 2.25, or even greater than or equal to 2.5. In embodiments, the upper bound of $(R_2O+RO)/Al_2O_3$ may be less than or equal to 4.5, less than or equal to 4.25, less than or equal to 4, less than or equal to 3.75, less than or equal to 3.5, less than or equal to 3.25, less than or equal to 3, or even less than or equal to 2.75. It should be understood that $(R_2O+RO)/Al_2O_3$ may be within a range formed from any one of the lower bounds for $(R_2O+RO)/Al_2O_3$ and any one of the upper bounds of $(R_2O+RO)/Al_2O_3$ described herein.

For example and without limitation, $(R_2O+RO)/Al_2O_3$ may range from 0.5 to 4.5. In embodiments, $(R_2O+RO)/Al_2O_3$ may range from 0.75 to 4.5. In embodiments, $(R_2O+RO)/Al_2O_3$ may range from 1 to 4.5. In embodiments, $(R_2O+RO)/Al_2O_3$ may range from 1.25 to 4.5. In embodiments, $(R_2O+RO)/Al_2O_3$ may range from 1.5 to 4.5. In embodiments, $(R_2O+RO)/Al_2O_3$ may range from 1.75 to 4.5. In embodiments, $(R_2O+RO)/Al_2O_3$ may range from 2 to 4.5. In embodiments, $(R_2O+RO)/Al_2O_3$ may range from 2.25 to 4.5. In embodiments, $(R_2O+RO)/Al_2O_3$ may range from 2.5 to 4.5. In embodiments, $(R_2O+RO)/Al_2O_3$ may range from 0.5 to 4.25. In embodiments, $(R_2O+RO)/Al_2O_3$ may range from 0.5 to 4. In embodiments, $(R_2O+RO)/Al_2O_3$ may range from 0.5 to 3.75. In embodiments, $(R_2O+RO)/Al_2O_3$ may range from 0.5 to 3.5. In embodiments, $(R_2O+RO)/Al_2O_3$ may range from 0.5 to 3.25. In embodiments, $(R_2O+RO)/Al_2O_3$ may range from 0.5 to 3. In embodiments, $(R_2O+RO)/Al_2O_3$ may range from 0.5 to 2.75.

As a further example, the ratio $(R_2O+RO+Y_2O_3)/Al_2O_3$ may be from 0.8 to 8. Without intending to be bound by any particular theory, it is believed that the ratio $(R_2O+RO+Y_2O_3)/Al_2O_3$ may have an impact on the rate of interdiffusion of ions. Each alkali ion may charge compensate a single aluminum ion, each alkaline earth ion may charge compensate two aluminum ions, and each yttria ion may charge compensate three aluminum ions. By charge compensating aluminum, the aluminum may maintain a tetrahedral coordination state. In contrast, in a non-compensating state, the aluminum may take on higher 5- and 6-fold coordination states. As a result, the free volume of the glass network may decrease along with the diffusivity of ions in the glass network. In embodiments, the lower bound of $(R_2O+RO+Y_2O_3)/Al_2O_3$ may be greater than 0.8, greater than or equal to 1, greater than or equal to 1.5, greater than or equal to 2, greater than or equal to 2.5, greater than or equal to 3, greater than or equal to 3.5, greater than or equal to 4, or even greater than or equal to 4.5. In embodiments, the upper bound of $(R_2O+RO+Y_2O_3)/Al_2O_3$ may be less than or equal to 8, less than or equal to 7.5, less than or equal to 7, less than or equal to 6.5, less than or equal to 6, less than or equal to 5.5, or even less than or equal to 5. It should be understood that $(R_2O+RO+Y_2O_3)/Al_2O_3$ may be within a range formed from any one of the lower bounds for $(R_2O+RO+Y_2O_3)/Al_2O_3$ and any one of the upper bounds of $(R_2O+RO+Y_2O_3)/Al_2O_3$ described herein.

For example and without limitation, $(R_2O+RO+Y_2O_3)/Al_2O_3$ may range from 0.8 to 8. In embodiments, $(R_2O+RO+Y_2O_3)/Al_2O_3$ may range from 1 to 8. In embodiments, $(R_2O+RO+Y_2O_3)/Al_2O_3$ may range from 1.5 to 8. In embodiments, $(R_2O+RO+Y_2O_3)/Al_2O_3$ may range from 2 to 8. In embodiments, $(R_2O+RO+Y_2O_3)/Al_2O_3$ may range from 2.5 to 8. In embodiments, $(R_2O+RO+Y_2O_3)/Al_2O_3$ may range from 3 to 8. In embodiments, $(R_2O+RO+Y_2O_3)/Al_2O_3$ may range from 3.5 to 8. In embodiments, $(R_2O+RO+Y_2O_3)/Al_2O_3$ may range from 4 to 8. In embodiments, $(R_2O+RO+Y_2O_3)/Al_2O_3$ may range from 4.5 to 8. In embodiments, $(R_2O+RO+Y_2O_3)/Al_2O_3$ may range from 0.8 to 7.5. In embodiments, $(R_2O+RO+Y_2O_3)/Al_2O_3$ may range from 0.8 to 7. In embodiments, $(R_2O+RO+Y_2O_3)/Al_2O_3$ may range from 0.8 to 6.5. In embodiments, $(R_2O+RO+Y_2O_3)/Al_2O_3$ may range from 0.8 to 6. In embodiments, $(R_2O+RO+Y_2O_3)/Al_2O_3$ may range from 0.5 to 5.5. In embodiments, $(R_2O+RO+Y_2O_3)/Al_2O_3$ may range from 0.5 to 5.

As a further example, the ratio $Al_2O_3/Y_2O_3$ may be from 0.25 to 9. Without intending to be bound by any particular theory, it is believed that the ratio $Al_2O_3/Y_2O_3$ may have an impact on the rate of interdiffusion of ions in the glass network. Each yttria ion may charge compensate three aluminum ions. By charge compensating aluminum, the aluminum may maintain a tetrahedral coordination state. In contrast, in a non-compensating state, the aluminum may take on higher 5- and 6-fold coordination states. As a result, the free volume of the glass network may decrease along with the diffusivity of ions in the glass network. In embodiments, the lower bound of $Al_2O_3/Y_2O_3$ may be greater than 0.25, greater than 0.5, greater than or equal to 1, greater than or equal to 1.5, greater than or equal to 2, greater than or equal to 2.5, greater than or equal to 3, greater than or equal to 3.5, greater than or equal to 4, or even greater than or equal to 4.5. In embodiments, the upper bound of $Al_2O_3/Y_2O_3$ may be less than or equal to 9, less than or equal to 8.5, less than or equal to 8, less than or equal to 7.5, less than or equal to 7, less than or equal to 6.5, less than or equal to 6, less than or equal to 5.5, or even less than or equal to 5. It should be understood that $Al_2O_3/Y_2O_3$ may be within a range formed from any one of the lower bounds for $Al_2O_3/Y_2O_3$ and any one of the upper bounds of $Al_2O_3/Y_2O_3$ described herein.

For example and without limitation, $Al_2O_3/Y_2O_3$ may range from 0.25 to 9. In embodiments, $Al_2O_3/Y_2O_3$ may range from 0.5 to 9. In embodiments, $Al_2O_3/Y_2O_3$ may range from 1 to 9. In embodiments $Al_2O_3/Y_2O_3$ may range from 1.5 to 9. In embodiments, $Al_2O_3/Y_2O_3$ may range from 2 to 9. In embodiments, $Al_2O_3/Y_2O_3$ may range from 2.5 to 9. In embodiments, $Al_2O_3/Y_2O_3$ may range from 3 to 9. In embodiments, $Al_2O_3/Y_2O_3$ may range from 3.5 to 9. In embodiments, $Al_2O_3/Y_2O_3$ may range from 4 to 9. In embodiments, $Al_2O_3/Y_2O_3$ may range from 4.5 to 9. In embodiments, $Al_2O_3/Y_2O_3$ may range from 0.25 to 8.5. In embodiments, $Al_2O_3/Y_2O_3$ may range from 0.25 to 8. In embodiments, $Al_2O_3/Y_2O_3$ may range from 0.25 to 7.5. In embodiments, $Al_2O_3/Y_2O_3$ may range from 0.25 to 7. In embodiments, $Al_2O_3/Y_2O_3$ may range from 0.25 to 6.5. In embodiments, $Al_2O_3/Y_2O_3$ may range from 0.25 to 6. In embodiments, $Al_2O_3/Y_2O_3$ may range from 0.25 to 5.5. In embodiments, $Al_2O_3/Y_2O_3$ may range from 0.25 to 5.

The glass compositions may be formed by mixing a batch of glass raw materials (e.g., powders of $SiO_2$, $Al_2O_3$, alkali carbonates, nitrates, or sulfates, alkaline earth carbonates, nitrates, sulfates, or oxides, and the like) such that the batch of glass raw materials has the desired glass composition. Common minerals such as spodumene and nepheline syenite may also be convenient sources of alkalis, alumina, and silica. Fining agents such as $CeO_2$, $Fe_2O_3$, and/or $SnO_2$ may also be added to aid in fining (bubble removal). Nitrates may also be added to fully oxidize the fining agents for optimal efficacy. Thereafter, the batch of glass raw materials may be heated to form a molten glass composition which is subsequently cooled and solidified to form a glass substrate comprising the glass composition. During cooling (i.e., when the glass composition is plastically deformable) the glass substrate comprising the glass composition may be shaped using standard forming techniques to shape the glass composition into a desired final form, providing a glass substrate comprising the glass composition. Alternatively, the glass substrate may be shaped into a stock form, such as a sheet, tube, or the like, and subsequently reheated and formed into the desired final form, such as by molding or the like. The glass substrate can then undergo ion exchange to form a glass article.

The glass substrates described herein have relatively high fracture toughness and critical strain energy release rates, and can be ion exchanged to form glass articles having parabolic stress profiles with relatively high central tension, such that the glass articles made from the glass compositions have enhanced drop performance relative to previously known articles.

In embodiments, the glass substrates or the glass articles described herein may have a Vicker's hardness of from 600 kilogram-force per square millimeter ($kgf/mm^2$) to 800 $kgf/mm^2$. For example, the Vicker's hardness may be from 625 $kgf/mm^2$ to 775 $kgf/mm^2$, or from 650 $kgf/mm^2$ to 750 $kgf/mm^2$, from 675 $kgf/mm^2$ to 725 $kgf/mm^2$, or even about 700 $kgf/mm^2$. Without intending to be bound by any particular theory, it is believed that glasses with higher hardnesses may be more damage and/or scratch resistant. By including high field strength cations as described herein, the resulting glass structure may be relatively more densely packed and thus more resistant to such damage and scratching.

In embodiments, the glass substrates or the glass articles described herein may have a fracture toughness $K_{1C}$ of greater than or equal to 0.72 MPa*√m. For example, the fracture toughness may be greater than or equal to 0.75 MPa*√m, greater than or equal to 0.8 MPa*√m, or even greater than or equal to 0.85 MPa*√m. In some embodiments, the fracture toughness may be from 0.75 MPa*√m to 0.9 MPa*√m. Without intending to be bound by any particular theory, it is believed that a high fracture toughness may be beneficial to prevent the propagation of cracks and also increase the stored strain energy limit for frangibility. Glass modifiers with relatively high cation field strengths contribute to increased fracture toughness, while glass formers with lower cation field strengths (such as $SiO_2$, $B_2O_3$, $P_2O_5$) decrease fracture toughness, as described above. Species that may increase the cation field strength include, for example and without limitation, $Y_2O_3$, $Li_2O$, $K_2O$, MgO, $Al_2O_3$, $La_2O_3$, $ZrO_2$, and $TiO_2$. Again, without intending to be bound by any particular theory, it is believed that high field strength ions produce stronger bonds in the glass network, which may increase the fracture toughness, relative to lower field strength ions.

In embodiments, the lower bounds of the total concentration of oxide modifiers comprising high field strength ions (i.e., the sum (mol. %) of $Y_2O_3+Li_2O+K_2O+MgO+Al_2O_3+La_2O_3+ZrO_2+TiO_2$) is greater than or equal to 15 mol. %, such as greater than or equal to 16 mol. %, greater than or equal to 17 mol. %, greater than or equal to 18 mol. %, greater than or equal to 19 mol. %, greater than or equal to 20 mol. %, greater than or equal to 21 mol. %, greater than or equal to 22 mol. %, greater than or equal to 23 mol. %, greater than or equal to 24 mol. %, or even greater than or equal to 25 mol. %, to improve the fracture toughness of the glass. In embodiments, the upper bounds of the total concentration of oxide modifiers comprising high field strength ions (i.e., the sum (mol. %) of $Y_2O_3+Li_2O+K_2O+MgO+Al_2O_3+La_2O_3+ZrO_2+TiO_2$) is less than or equal to 35 mol. %, such as less than or equal to 34 mol. %, less than or equal to 33 mol. %, less than or equal to 32 mol. %, less than or equal to 31 mol. %, less than or equal to 30 mol. %, less than or equal to 29 mol. %, less than or equal to 28 mol. %, less than or equal to 27 mol. %, less than or equal to 26 mol. %, or even less than or equal to 25 mol. %. It should be understood that the total concentration of oxide modifiers comprising high field strength ions (i.e., the sum (mol. %) of $Y_2O_3+Li_2O+K_2O+MgO+Al_2O_3+La_2O_3+ZrO_2+TiO_2$) may be within a range formed from any one of the lower bounds and any one of the upper bounds described herein.

For example, in embodiments, the total concentration of oxide modifiers comprising high field strength ions (i.e., the sum (mol. %) of $Y_2O_3+Li_2O+K_2O+MgO+Al_2O_3+La_2O_3+ZrO_2+TiO_2$) is greater than or equal to 15 mol. % and less than or equal to 35 mol. %, greater than or equal to 20 mol. % and less than or equal to 30 mol. %, greater than or equal to 25 mol. % and less than or equal to 30 mol. %, greater than or equal to 25 mol. % and less than or equal to 29 mol. %, greater than or equal to 18 mol. % and less than or equal to 25 mol. %, or even greater than or equal to 29 mol. % and less than or equal to 31 mol. %.

In embodiments, the glass substrates or glass articles described herein may have a critical strain energy release rate $G_{1C}$ of than 7 J/m². For example, the critical strain energy release rate may be greater than or equal to 7.5 J/m², greater than or equal to 8 J/m², or even greater than or equal to 8.5 J/m². The critical strain energy release rate is the energy it takes to create new crack surfaces, so the higher that energy the more impact energy the glass can withstand before generating cracks. A higher critical strain energy release rate also means that more impact energy is dissipated per unit length of crack generated. Thus the higher the critical strain energy release rate, the better the drop performance for the same stress profile.

In embodiments, the glass substrates or glass articles described herein may have a Young's modulus $E_{mod}$ of greater than 70 GPa. For example, $E_{mod}$ may be greater than or equal to 75 GPa, greater than or equal to 80 GPa, greater than or equal to 85 GPa, greater than or equal to 90 GPa, greater than or equal to 95 GPa, greater than or equal to 100 GPa, or even greater than or equal to 105 GPa. In some embodiments $E_{mod}$ may be from 75 GPa to 110 GPa. The higher the $E_{mod}$, the greater the stress generated by ion exchange and the stronger the compressive layer.

In embodiments, the glass substrates or glass articles described herein may have a shear modulus of greater than 30 GPa. For example, the shear modulus may be greater than or equal to 35 GPa, or even greater than or equal to 40 GPa. In some embodiments the shear modulus may be from 30 GPa to 45 GPa. Without intending to be bound by any particular theory, it is believed that a glass substrate or glass article having a shear modulus of greater than 30 GPa may exhibit a more favorable stiffness under shear stress conditions.

In embodiments, the glass substrates or glass articles described herein may have a Poisson's ratio of from 0.21 to 0.25. For instance, the Poisson's ratio may be 0.21, 0.22, 0.23, 0.24, 0.25, or any fractional part thereof.

In embodiments, the glass composition described herein may have a liquidus viscosity of from 3 kilopoise (kP) to 50 kP. For instance the liquidus viscosity may be from 5 kP to 45 kP, from 10 kP to 40 kP, from 15 kP to 35 kP, from 20 kP to 30 kP, or even about 25 kP. Without intending to be bound by any particular theory, it is believed that a higher liquidus viscosity aids in processing the glass composition (and the glass article made therefrom). For instance, a higher liquidus viscosity may increase the rollability of the glass. It is also believed that the liquidus viscosity can be increased by including higher concentrations of alkali metal oxides ($R_2O$) and $B_2O_3$ in the glass compositions.

In embodiments, the glass composition described herein may have a liquidus temperature of from 1150° C. to 1400° C. For instance the liquidus temperature may be from 1175° C. to 1375° C., from 1200° C. to 1350° C., from 1225° C. to 1325° C., from 1250° C. to 1300° C., or even about 1275° C. Without intending to be bound by any particular theory, it is believed that a lower liquidus temperature aids in processing the glass composition (and the glass article made therefrom). For instance, a lower liquidus temperature may increase the rollability of the glass. It is also believed that the liquidus temperature can be lowered by including higher concentrations of alkali metal oxides ($R_2O$) and $B_2O_3$ in the glass compositions.

In embodiments, the glass composition described herein may have a strain point of from 500° C. to 750° C. For instance the strain point may be from 525° C. to 725° C., from 550° C. to 700° C., from 575° C. to 675° C., from 600° C. to 650° C., or even about 625° C. Without intending to be bound by any particular theory, it is believed that a higher strain point allows for ion exchange at elevated temperatures, which may allow for strengthening of the glass article made from the glass composition in shorter amounts of time relative to strengthening at lower temperatures. It is also believed that the strain point can be increased by including higher concentrations of high field strength ions, which may form stronger bonds in the glass network (even when creating non-bridging oxygen atoms), in turn increasing the viscosity of the glass compared to more typical modifiers with lower field strength ions, such as $Na_2O$, $K_2O$, and CaO.

In embodiments, the glass substrates or glass articles described herein may have an index of refraction (also called a refractive index) of from 1.5 to 1.6 at 589.3 nm. For instance, the refractive index at 589.3 nm may be 1.5, 1.51, 1.52, 1.53, 1.54, 1.55, 1.56, 1.57, 1.58, 1.59, 1.6, or any fractional part thereof.

In embodiments, the glass substrates or glass articles described herein may have a stress optical coefficient of from 2 nm/MPa/cm to 3.2 nm/MPa/cm. For instance, the stress optical coefficient may be 2 nm/MPa/cm, 2.1 nm/MPa/cm, 2.2 nm/MPa/cm, 2.3 nm/MPa/cm, 2.4 nm/MPa/cm, 2.5 nm/MPa/cm, 2.6 nm/MPa/cm, 2.7 nm/MPa/cm, 2.8 nm/MPa/cm, 2.9 nm/MPa/cm, 3 nm/MPa/cm, 3.1 nm/MPa/cm, 3.2 nm/MPa/cm, or any fractional part thereof.

When strengthened by ion exchange, the glass article described herein may have a compressive stress region extending from a first surface to a depth of compression. The glass article may have a tensile stress region extending from the depth of compression on one side to the depth of compression on the other side. In some embodiments, the tensile stress region may have a maximum CT of greater than or equal to 140 MPa. In embodiments, this maximum CT may range from 140 MPa to 600 MPa, from 150 MPa to 575 MPa, from 175 MPa to 550 MPa, from 200 MPa to 525 MPa, from 225 MPa to 500 MPa, from 250 MPa to 475 MPa, from 275 MPa to 450 MPa, from 300 MPa to 425 MPa, from 325 MPa to 400 MPa, or even from 350 MPa to 375 MPa. In some embodiments, the glass substrate is strengthened by ion exchange in a 100% $NaNO_3$ bath at 430° C. for from 2 to 4 hours, and the maximum CT is from 140 MPa to 210 MPa. In some embodiments, the glass substrate is strengthened by ion exchange in a mixed bath comprising $NaNO_3$ and $KNO_3$ at 430° C. for from 2 to 16 hours and has a maximum CT of from 90 MPa to 280 MPa. In some embodiments, the glass substrate is strengthened by ion exchange in a mixed bath comprising from 75% to 85% $NaNO_3$ and from 15% to 25% $KNO_3$ at 430° C. for from 2 to 16 hours and has a maximum CT of from 150 MPa to 280 MPa. It should be understood that the maximum CT may be within a range formed from any one of the lower bounds for the maximum CT and any one of the upper bounds for the maximum CT described herein.

When strengthened by ion exchange, the glass articles described herein may have a stored strain energy of greater than 20 J/m². For example, the stored strain energy may be greater than or equal to 23 J/m², greater than or equal to 24 J/m², greater than or equal to 25 J/m², greater than or equal to 30 J/m², greater than or equal to 40 J/m², greater than or equal to 50 J/m², greater than or equal to 60 J/m², greater than or equal to 70 J/m², greater than or equal to 80 J/m², greater than or equal to 90 J/m², greater than or equal to 100 J/m², greater than or equal to 200 J/m², greater than or equal to 300 J/m², greater than or equal to 400 J/m², or even greater than or equal to 500 J/m². Without intending to be bound by any particular theory, it is believed that a combination of high modulus and high fracture toughness may produce a glass article having high stored strain energy. In turn, a higher stored strain energy may mean that more stress may be installed into the glass article for a given thickness without producing a diced fragmentation pattern upon failure of the glass article. For example, and without limitation, a glass having a stored strain energy of 23 $J/m^2$ may allow for a significantly greater amount of stress to be installed in the glass compared to a glass having a stored strain energy of, for example 20 $J/m^2$. The greater amount of installed stress generally contributes to improved glass durability.

In one or more embodiments, the glass article described herein may be used in the manufacture of electronic devices. For instance, and without limitation, the glass article may be used as a cover element in an electronic device. A cover substrate for a display of an electronic device protects a display screen and provides an optically transparent surface through which a user can view the display screen.

When the glass article described herein is used as a cover substrate for consumer products, e.g. as a "cover glass," the glass article may serve to, among other things, reduce undesired reflections, prevent formation of mechanical defects in the glass article (e.g., scratches or cracks), and/or provide an easy to clean transparent surface. Such cover substrates may be incorporated into another article such as an article with a display (or display articles). Such display articles include, without limitation, consumer electronic products, including mobile phones, tablets, computers, navigation systems, wearable devices such as watches and the like, architectural articles, transportation articles, appliance articles, or any article that may benefit from some transparency, scratch-resistance, abrasion resistance, or a combination thereof. An exemplary article incorporating the glass article disclosed herein is a consumer electronic device including a housing having front, back, and side surfaces; electrical components that are at least partially inside or entirely within the housing and including at least a controller, a memory, and a display at or adjacent to the front surface of the housing; and a cover substrate at or over the front surface of the housing such that it is over the display. In some embodiments, the cover substrate may include any of the embodiments of the glass article disclosed herein. In some embodiments, at least a portion of at least one of the housing or the cover substrate comprises the glass article disclosed herein.

The glass articles described herein exhibit high fracture toughness and Young's moduli. As a result, the frangibility limit of the glass articles is greater than previously known strengthened glasses, yielding an advantage in the amount of stress that can be supported. Mechanical performance is, therefore, improved relative to the previously known strengthened glasses. The glass articles can also achieve a sufficiently high CT value and correspondingly high stored strain energy to exhibit a diced fragmentation pattern as a result of flaw introduction, which may be an advantage in the applications described above.

EXAMPLES

The embodiments described herein will be further clarified by the following examples.

The glass compositions were formed by mixing a batch of glass raw materials (e.g., powders of $SiO_2$, $Al_2O_3$, alkali carbonates, nitrates, or sulfates, alkaline earth carbonates, nitrates, sulfates, or oxides, and the like, as provided in Tables 1A-1F) such that the batch of glass raw materials has the desired glass composition. Thereafter, the batch of glass raw materials was heated to form a molten glass composition and then poured into a bucket of water to create cullet. This cullet was then remelted at a slightly higher temperature to remove bubbles. This double melting procedure improves the quality and homogeneity of the resulting glass article for laboratory scale melting. The molten glass composition was then poured onto a steel table and allowed to set before it was placed in an annealer at approximately the anneal point of the glass composition to remove stress. The resultant glass substrates was then cooled to room temperature and cut and polished into samples for measurement.

TABLE 1A

| Sample/mol % | 1 | 2 | 3 | 4 | 5 | 6 | 7 |
|---|---|---|---|---|---|---|---|
| $SiO_2$ | 63.9 | 62.4 | 60.9 | 63.9 | 62.4 | 60.9 | 67 |
| $Al_2O_3$ | 18.5 | 20 | 21.5 | 18.5 | 20 | 21.5 | 10.8 |
| $B_2O_3$ | 0 | 0 | 0 | 0 | 0 | 0 | 0 |
| $Li_2O$ | 2.5 | 2.5 | 2.5 | 5 | 5 | 5 | 6.6 |
| $Na_2O$ | 12.5 | 12.5 | 12.5 | 10 | 10 | 10 | 7 |
| MgO | 0 | 0 | 0 | 0 | 0 | 0 | 2.9 |
| CaO | 0 | 0 | 0 | 0 | 0 | 0 | 0 |
| $Y_2O_3$ | 2.5 | 2.5 | 2.5 | 2.5 | 2.5 | 2.5 | 5.9 |
| $P_2O_5$ | 0 | 0 | 0 | 0 | 0 | 0 | 0 |
| $K_2O$ | 0 | 0 | 0 | 0 | 0 | 0 | 0 |
| $SnO_2$ | 0.1 | 0.1 | 0.1 | 0.1 | 0.1 | 0.1 | 0.1 |
| $Y_2O_3 + Al_2O_3$ | 21 | 22.5 | 24 | 21 | 22.5 | 24 | 16.7 |
| $R_2O$ | 15 | 15 | 15 | 15 | 15 | 15 | 13.6 |
| RO | 0 | 0 | 0 | 0 | 0 | 0 | 2.9 |
| RO / $Al_2O_3$ | 0 | 0 | 0 | 0 | 0 | 0 | 0.27 |
| $R_2O$ / $Al_2O_3$ | 0.81 | 0.75 | 0.7 | 0.81 | 0.75 | 0.7 | 1.26 |
| ($R_2O$ + RO) / $Al_2O_3$ | 0.81 | 0.75 | 0.7 | 0.81 | 0.75 | 0.7 | 1.53 |
| $B_2O_3 + Na_2O$ | 12.5 | 12.5 | 12.5 | 10 | 10 | 10 | 7 |
| ($R_2O$ + RO + $Y_2O_3$) / $Al_2O_3$ | 0.95 | 0.88 | 0.81 | 0.95 | 0.88 | 0.81 | 2.07 |
| $Al_2O_3$ / $Y_2O_3$ | 7.4 | 8 | 8.6 | 7.4 | 8 | 8.6 | 1.83 |

TABLE 1B

| Sample/mol % | 8 | 9 | 10 | 11 | 12 | 13 | 14 |
|---|---|---|---|---|---|---|---|
| $SiO_2$ | 67 | 65 | 67 | 66.2 | 65 | 65 | 65 |
| $Al_2O_3$ | 5.8 | 12.4 | 8.2 | 10.2 | 12 | 12 | 12 |
| $B_2O_3$ | 0 | 1.8 | 10.6 | 9.1 | 4 | 6 | 8 |
| $Li_2O$ | 6.6 | 7 | 8.1 | 8.5 | 9 | 9 | 9 |
| $Na_2O$ | 7 | 6.2 | 1.8 | 1.8 | 2 | 2 | 2 |
| MgO | 2.9 | 2.8 | 0.1 | 0.1 | 0 | 0 | 0 |
| CaO | 0 | 0 | 2.1 | 2.1 | 2 | 2 | 2 |
| $Y_2O_3$ | 10.9 | 2 | 2 | 2 | 6 | 4 | 2 |
| $P_2O_5$ | 0 | 3 | 0 | 0 | 0 | 0 | 0 |
| $K_2O$ | 0 | 0 | 0 | 0 | 0 | 0 | 0 |
| $SnO_2$ | 0.1 | 0.1 | 0 | 0 | 0 | 0 | 0 |
| $Y_2O_3 + Al_2O_3$ | 16.7 | 14.4 | 10.2 | 12.2 | 18 | 16 | 14 |
| $R_2O$ | 13.6 | 13.2 | 9.9 | 10.3 | 11 | 11 | 11 |
| RO | 2.9 | 2.8 | 2.2 | 2.2 | 2 | 2 | 2 |
| RO / $Al_2O_3$ | 0.50 | 0.23 | 0.27 | 0.22 | 0.17 | 0.17 | 0.17 |
| $R_2O$ / $Al_2O_3$ | 2.34 | 1.06 | 1.21 | 1.01 | 0.92 | 0.92 | 0.92 |
| ($R_2O$ + RO) / $Al_2O_3$ | 2.84 | 1.29 | 1.48 | 1.23 | 1.08 | 1.08 | 1.08 |
| $B_2O_3 + Na_2O$ | 7 | 8 | 12.4 | 10.9 | 6 | 8 | 10 |
| ($R_2O$ + RO + $Y_2O_3$) / $Al_2O_3$ | 4.72 | 1.45 | 1.72 | 1.42 | 1.58 | 1.42 | 1.25 |
| $Al_2O_3$ / $Y_2O_3$ | 0.53 | 6.2 | 4.1 | 5.1 | 2 | 3 | 6 |

TABLE 1C

| Sample/mol % | 15 | 16 | 17 | 18 | 19 | 20 | 21 |
|---|---|---|---|---|---|---|---|
| $SiO_2$ | 69 | 69 | 67 | 67 | 67 | 67 | 66.9 |
| $Al_2O_3$ | 12.8 | 12.8 | 12.8 | 10.8 | 10.8 | 12.8 | 8.2 |
| $B_2O_3$ | 0 | 1.9 | 3.9 | 4 | 5.9 | 1.9 | 10.6 |

TABLE 1C-continued

| Sample/mol % | 15 | 16 | 17 | 18 | 19 | 20 | 21 |
|---|---|---|---|---|---|---|---|
| $Li_2O$ | 9.2 | 9.2 | 9.2 | 9.2 | 9.2 | 9.5 | 10.1 |
| $Na_2O$ | 2.4 | 2.4 | 2.4 | 2.4 | 2.4 | 3.5 | 0 |
| MgO | 2.9 | 2.9 | 2.9 | 2.9 | 2.9 | 2.9 | 0.1 |
| CaO | 0 | 0 | 0 | 0 | 0 | 0 | 2.1 |
| $Y_2O_3$ | 3.9 | 2 | 2 | 3.9 | 2 | 2 | 2 |
| $P_2O_5$ | 0 | 0 | 0 | 0 | 0 | 0 | 0 |
| $K_2O$ | 0 | 0 | 0 | 0 | 0 | 0.5 | 0 |
| $SnO_2$ | 0.1 | 0.1 | 0.1 | 0.1 | 0.1 | 0.1 | 0 |
| $Y_2O_3 + Al_2O_3$ | 16.7 | 14.8 | 14.8 | 14.7 | 12.8 | 14.8 | 10.2 |
| $R_2O$ | 11.6 | 11.6 | 11.6 | 11.6 | 11.6 | 13.5 | 10.1 |
| RO | 2.9 | 2.9 | 2.9 | 2.9 | 2.9 | 2.9 | 2.2 |
| $RO / Al_2O_3$ | 0.23 | 0.23 | 0.23 | 0.27 | 0.27 | 0.23 | 0.27 |
| $R_2O / Al_2O_3$ | 0.91 | 0.91 | 0.91 | 1.07 | 1.07 | 1.05 | 1.23 |
| $(R_2O + RO) / Al_2O_3$ | 1.13 | 1.13 | 1.13 | 1.34 | 1.34 | 1.28 | 1.5 |
| $B_2O_3 + Na_2O$ | 2.4 | 4.3 | 6.3 | 6.4 | 8.3 | 5.4 | 10.6 |
| $(R_2O + RO + Y_2O_3) / Al_2O_3$ | 1.44 | 1.29 | 1.29 | 1.70 | 1.53 | 1.44 | 1.74 |
| $Al_2O_3 / Y_2O_3$ | 3.28 | 6.4 | 6.4 | 2.77 | 5.4 | 6.4 | 4.1 |

TABLE 1D

| Sample/mol % | 22 | 23 | 24 | 25 | 26 | 27 | 28 |
|---|---|---|---|---|---|---|---|
| $SiO_2$ | 66.5 | 67 | 66.1 | 65.9 | 64.2 | 65 | 65 |
| $Al_2O_3$ | 10.3 | 11.8 | 10.1 | 10 | 12.3 | 12 | 12 |
| $B_2O_3$ | 8.9 | 3.9 | 6.2 | 3.5 | 4 | 4 | 6 |
| $Li_2O$ | 10.2 | 10.2 | 10.3 | 10.5 | 10.7 | 11 | 11 |
| $Na_2O$ | 0 | 2.4 | 0 | 0 | 2.3 | 0 | 0 |
| MgO | 0.1 | 2.9 | 0.1 | 0.1 | 2.8 | 0 | 0 |
| CaO | 2.1 | 0 | 2.1 | 2.1 | 0 | 2 | 2 |
| $Y_2O_3$ | 2 | 2 | 5 | 7.9 | 3.9 | 6 | 4 |
| $P_2O_5$ | 0 | 0 | 0 | 0 | 0 | 0 | 0 |
| $K_2O$ | 0 | 0 | 0 | 0 | 0 | 0 | 0 |
| $SnO_2$ | 0 | 0.1 | 0 | 0 | 0.1 | 0 | 0 |
| $Y_2O_3 + Al_2O_3$ | 12.3 | 13.8 | 15.1 | 17.9 | 16.2 | 18 | 16 |
| $R_2O$ | 10.2 | 12.6 | 10.3 | 10.5 | 13 | 11 | 11 |
| RO | 2.2 | 2.9 | 2.2 | 2.2 | 2.8 | 2 | 2 |
| $RO / Al_2O_3$ | 0.21 | 0.25 | 0.22 | 0.22 | 0.23 | 0.17 | 0.17 |
| $R_2O / Al_2O_3$ | 0.99 | 1.07 | 1.02 | 1.05 | 1.06 | 0.92 | 0.92 |
| $(R_2O + RO) / Al_2O_3$ | 1.2 | 1.31 | 1.24 | 1.27 | 1.28 | 1.08 | 1.08 |
| $B_2O_3 + Na_2O$ | 8.9 | 6.3 | 6.2 | 3.5 | 6.3 | 4 | 6 |
| $(R_2O + RO + Y_2O_3) / Al_2O_3$ | 1.4 | 1.48 | 1.73 | 2.06 | 1.6 | 1.58 | 1.42 |
| $Al_2O_3 / Y_2O_3$ | 5.15 | 5.9 | 2.02 | 1.27 | 3.15 | 2 | 3 |

TABLE 1E

| Sample/mol % | 29 | 30 | 31 | 32 | 33 | 34 | 35 |
|---|---|---|---|---|---|---|---|
| $SiO_2$ | 65 | 67 | 67 | 67 | 67 | 67 | 67 |
| $Al_2O_3$ | 12 | 14.8 | 12.8 | 12.8 | 12.8 | 10.8 | 10.8 |
| $B_2O_3$ | 8 | 1.9 | 0 | 1.9 | 1.9 | 0 | 1.9 |
| $Li_2O$ | 11 | 11.2 | 11.2 | 11.2 | 11.2 | 11.2 | 11.2 |
| $Na_2O$ | 0 | 2.4 | 2.4 | 2.4 | 2.4 | 2.4 | 2.4 |
| MgO | 0 | 2.9 | 2.9 | 2.9 | 2.9 | 2.9 | 2.9 |
| CaO | 2 | 0 | 0 | 0 | 0 | 0 | 0 |
| $Y_2O_3$ | 2 | 0 | 3.9 | 2 | 2 | 5.9 | 4 |
| $P_2O_5$ | 0 | 0 | 0 | 0 | 0 | 0 | 0 |
| $K_2O$ | 0 | 0 | 0 | 0 | 0 | 0 | 0 |
| $SnO_2$ | 0 | 0.1 | 0.1 | 0.1 | 0.1 | 0.1 | 0.1 |
| $Y_2O_3 + Al_2O_3$ | 14 | 14.8 | 16.7 | 14.8 | 14.8 | 16.7 | 14.8 |
| $R_2O$ | 11 | 13.6 | 13.6 | 13.6 | 13.6 | 13.6 | 13.6 |
| RO | 2 | 2.9 | 2.9 | 2.9 | 2.9 | 2.9 | 2.9 |
| $RO / Al_2O_3$ | 0.17 | 0.20 | 0.23 | 0.23 | 0.23 | 0.27 | 0.27 |
| $R_2O / Al_2O_3$ | 0.92 | 0.92 | 1.06 | 1.06 | 1.06 | 1.26 | 1.26 |

TABLE 1E-continued

| Sample/mol % | 29 | 30 | 31 | 32 | 33 | 34 | 35 |
|---|---|---|---|---|---|---|---|
| $(R_2O + RO) / Al_2O_3$ | 1.08 | 1.11 | 1.29 | 1.29 | 1.29 | 1.53 | 1.53 |
| $B_2O_3 + Na_2O$ | 8 | 4.3 | 2.4 | 4.3 | 4.3 | 2.4 | 4.3 |
| $(R_2O + RO + Y_2O_3) / Al_2O_3$ | 1.25 | 1.11 | 1.59 | 1.45 | 1.45 | 2.07 | 1.9 |
| $Al_2O_3 / Y_2O_3$ | 6 | — | 3.28 | 6.4 | 6.4 | 1.83 | 2.7 |

TABLE 1F

| Sample/mol % | 36 | 37 | 38 | 39 | 40 | 41 |
|---|---|---|---|---|---|---|
| $SiO_2$ | 67 | 67 | 67 | 67 | 67 | 67 |
| $Al_2O_3$ | 8.8 | 12.8 | 5.8 | 3.8 | 12.8 | 10.8 |
| $B_2O_3$ | 0 | 0 | 0 | 0 | 1.9 | 1.9 |
| $Li_2O$ | 11.2 | 11.2 | 11.2 | 11.2 | 13.2 | 13.2 |
| $Na_2O$ | 2.4 | 2.4 | 2.4 | 2.4 | 0.4 | 0.4 |
| MgO | 2.9 | 4.9 | 2.9 | 2.9 | 2.9 | 2.9 |
| CaO | 0 | 0 | 0 | 0 | 0 | 0 |
| $Y_2O_3$ | 7.9 | 1.9 | 10.9 | 12.9 | 2 | 4 |
| $P_2O_5$ | 0 | 0 | 0 | 0 | 0 | 0 |
| $K_2O$ | 0 | 0 | 0 | 0 | 0 | 0 |
| $SnO_2$ | 0.1 | 0.1 | 0.1 | 0.1 | 0.1 | 0.1 |
| $Y_2O_3 + Al_2O_3$ | 16.7 | 14.7 | 16.7 | 16.7 | 14.8 | 14.8 |
| $R_2O$ | 13.6 | 13.6 | 13.6 | 13.6 | 13.6 | 13.6 |
| RO | 2.9 | 4.9 | 2.9 | 2.9 | 2.9 | 2.9 |
| $RO / Al_2O_3$ | 0.33 | 0.38 | 0.50 | 0.76 | 0.23 | 0.27 |
| $R_2O / Al_2O_3$ | 1.55 | 1.06 | 2.34 | 3.58 | 1.06 | 1.26 |
| $(R_2O + RO) / Al_2O_3$ | 1.88 | 1.45 | 2.84 | 4.34 | 1.29 | 1.53 |
| $B_2O_3 + Na_2O$ | 2.4 | 2.4 | 2.4 | 2.4 | 2.3 | 2.3 |
| $(R_2O + RO + Y_2O_3) / Al_2O_3$ | 2.77 | 1.59 | 4.72 | 7.74 | 1.45 | 1.9 |
| $Al_2O_3 / Y_2O_3$ | 1.11 | 6.74 | 0.53 | 0.29 | 6.4 | 2.7 |

The properties of the glass compositions, glass substrates, and glass articles were investigated by methods discussed above, and the results are tabulated in Tables 2A-2F. The strain point and liquidus temperature are reported in ° C. Liquidus viscosity is reported in P. $K_{1C}$ is reported in MPa*√m. The Vicker's hardness is reported in kgf/mm². The shear modulus and Young's modulus are reported in GPa. Poisson's ratio and the refractive index are unitless. $G_{1C}$ is reported in J/m². SOC is reported in nm/MPa/cm. The stored strain energy is reported in J/m² and the ion exchange conditions to attain these stored strain energy values are reported. Maximum CT values are reported in MPa and the ion exchange conditions to attain these maximum CT values are reported. The ion exchange baths were all heated to 430° C.

TABLE 2A

| Property | 1 | 2 | 3 | 4 | 5 | 6 | 7 |
|---|---|---|---|---|---|---|---|
| Strain (° C.) | 703 | 708.7 | 710.1 | 680.4 | 684.1 | 688.5 | |
| Liquidus temperature (° C.) | | | | | | | |
| Liquidus viscosity (P) | | | | | | | |
| $K_{1C}$ (MPa * √m) | | | | | | | 0.8 |
| Vicker's hardness (kgf/mm$^2$) | | | | | | | 668 |
| Poisson's ratio | 0.224 | 0.223 | 0.232 | 0.22 | 0.227 | 0.229 | 0.223 |
| Shear modulus (GPa) | 33.44 | 33.85 | 34.34 | 34.47 | 35.03 | 34.4 | 36.3 |
| Young's modulus (GPa) | 81.91 | 82.81 | 84.53 | 84.18 | 85.91 | 84.53 | 88.7 |
| $G_{1C}$ (J/m$^2$) | | | | | | | 7.22 |
| SOC (nm/MPa/cm) | 2.893 | 2.881 | 2.84 | 2.855 | 2.816 | 2.787 | 2.68 |
| Refractive index | 1.5259 | 1.5285 | 1.5313 | 1.5291 | 1.5333 | 1.5353 | |
| Stored Strain Energy (J/m$^2$) | | | | | | | |
| 100% NaNO$_3$, 2 h | | | | | | | |
| 100% NaNO$_3$, 4 h | | | | | | | |
| 100% NaNO$_3$, 16 h | | | | | | | |
| 80% NaNO$_3$ / 20% KNO$_3$, 2 h | | | | | | | |
| 80% NaNO$_3$ / 20% KNO$_3$, 4 h | | | | | | | |
| 80% NaNO$_3$ / 20% KNO$_3$, 16 h | | | | | | | |
| Maximum CT (MPa) | | | | | | | |
| 100% NaNO$_3$, 2 h | | | | | | | |
| 100% NaNO$_3$, 3 h | | | | | | | |
| 100% NaNO$_3$, 4 h | | | | | | | |
| 100% NaNO$_3$, 7 h | | | | | | | |
| 100% NaNO$_3$, 16 h | | | | | | | |
| 80% NaNO$_3$ / 20% KNO$_3$, 2 h | | | | | | | |
| 80% NaNO$_3$ / 20% KNO$_3$, 4 h | | | | | | | |
| 80% NaNO$_3$ / 20% KNO$_3$, 16 h | | | | | | | |

TABLE 2B

| Property | 8 | 9 | 10 | 11 | 12 | 13 | 14 |
|---|---|---|---|---|---|---|---|
| Strain (° C.) | | | 519 | 532 | 620 | 589 | 559 |
| Liquidus temperature (° C.) | | 1295 | | 1165 | 1200 | 1335 | 1315 |
| Liquidus viscosity (P) | | | | | | | |
| $K_{1C}$ (MPa * √m) | 0.83 | 0.76 | | | | | |
| Vicker's hardness (kgf/mm$^2$) | 748 | | | | | | |
| Poisson's ratio | 0.238 | 0.211 | 0.215 | 0.22 | 0.229 | 0.228 | 0.225 |
| Shear modulus (GPa) | 38.7 | 33.1 | 32.3 | 32.2 | 36.3 | 34.4 | 32.5 |
| $E_{mod}$ (GPa) | 96 | 80.3 | 78.4 | 78.6 | 89.4 | 84.5 | 79.6 |
| $G_{1C}$ (J/m$^2$) | 7.18 | 7.19 | | | | | |
| SOC (nm/MPa/cm) | 2.444 | 2.975 | 3.162 | 3.128 | 2.73 | 2.903 | 3.099 |
| Refractive index | | | 1.518 | 1.52 | 1.522 | | |
| Stored Strain Energy (J/m$^2$) | | | | | | | |
| 100% NaNO$_3$, 2 h | | | 13 | 19 | | | |
| 100% NaNO3, 4 h | | | 21 | 33 | | | |
| 100% NaNO$_3$, 16 h | | | 31 | 47 | | | |
| 80% NaNO$_3$ / 20% KNO$_3$, 2 h | | | 13 | 19 | | | |
| 80% NaNO$_3$ / 20% KNO$_3$, 4 h | | | 20 | 35 | | | |
| 80% NaNO$_3$ / 20% KNO$_3$, 16 h | | | 25 | 52 | | | |

TABLE 2B-continued

| Property | 8 | 9 | 10 | 11 | 12 | 13 | 14 |
|---|---|---|---|---|---|---|---|
| Maximum CT (MPa) | | | | | | | |
| 100% NaNO$_3$, 2 h | 35.45 | | 51 | 62 | | | |
| 100% NaNO$_3$, 3 h | | | | | | | |
| 100% NaNO$_3$, 4 h | 45.67 | | 72 | 89 | | | |
| 100% NaNO$_3$, 7 h | | | | | | | |
| 100% NaNO$_3$, 16 h | 69.32 | | 99 | 132 | | | |
| 80% NaNO$_3$ / 20% KNO$_3$, 2 h | | | 49 | 65 | | | |
| 80% NaNO$_3$ / 20% KNO$_3$, 4 h | | | 66 | 89 | | | |
| 80% NaNO$_3$ / 20% KNO$_3$, 16 h | | | 84 | 132 | | | |

TABLE 2C

| Property | 15 | 16 | 17 | 18 | 19 | 20 | 21 |
|---|---|---|---|---|---|---|---|
| Strain (° C.) | | | | | | | 524 |
| Liquidus temperature (° C.) | | | | | | | |
| Liquidus viscosity (P) | | | | | | | |
| K$_{1C}$ (MPa * √m) | 0.8 | 0.8 | 0.81 | 0.82 | 0.79 | 0.8 | |
| Vicker's hardness (kgf/mm$^2$) | | | | | | | |
| Poisson's ratio | 0.223 | 0.22 | 0.219 | 0.233 | 0.22 | 0.221 | 0.218 |
| Shear modulus (GPa) | 36.7 | 35 | 34.2 | 35 | 33.3 | 34.5 | 32.3 |
| E$_{mod}$ (GPa) | 89.8 | 85.3 | 83.4 | 86.1 | 81 | 84.7 | 78.6 |
| G$_{1C}$ (J/m$^2$) | 7.13 | 7.50 | 7.87 | 7.81 | 7.70 | 7.56 | |
| SOC (nm/MPa/cm) | 2.763 | 2.921 | 2.961 | 2.868 | 3.034 | 2.88 | 3.142 |
| Refractive index | | | | | | | 1.523 |
| Stored Strain Energy (J/m$^2$) | | | | | | | |
| 100% NaNO$_3$, 2 h | | | | | | | 14 |
| 100% NaNO$_3$, 4 h | | | | | | | 26 |
| 100% NaNO$_3$, 16 h | | | | | | | 48 |
| 80% NaNO$_3$ / 20% KNO$_3$, 2 h | | | | | | | 13 |
| 80% NaNO$_3$ / 20% KNO$_3$, 4 h | | | | | | | 24 |
| 80% NaNO$_3$ / 20% KNO$_3$, 16 h | | | | | | | 22 |
| Maximum CT (MPa) | | | | | | | |
| 100% NaNO$_3$, 2 h | 125 | 100.1 | 97.9 | 79.9 | 92.6 | 117.6 | 57 |
| 100% NaNO$_3$, 3 h | | | | | | | |
| 100% NaNO$_3$, 4 h | 195.8 | 172.4 | 166.6 | 107.6 | 135.2 | 160.3 | 78 |
| 100% NaNO$_3$, 7 h | | | | | | | |
| 100% NaNO$_3$, 16 h | 113.2 | 156.1 | 149.1 | 79.4 | 122.1 | 129.8 | 131 |
| 80% NaNO$_3$ / 20% KNO$_3$, 2 h | | | | | | | 45 |
| 80% NaNO$_3$ / 20% KNO$_3$, 4 h | | | | | | | 71 |
| 80% NaNO$_3$ / 20% KNO$_3$, 16 h | | | | | | | 69 |

55

TABLE 2D

| Property | 22 | 23 | 24 | 25 | 26 | 27 | 28 |
|---|---|---|---|---|---|---|---|
| Strain (° C.) | 546 | | 578 | 622 | | 626 | 588 |
| Liquidus temperature (° C.) | 1165 | | 1340 | 1385 | | 1335 | 1335 |
| Liquidus viscosity (P) | | | | | | | |

TABLE 2D-continued

| Property | 22 | 23 | 24 | 25 | 26 | 27 | 28 |
|---|---|---|---|---|---|---|---|
| $K_{1C}$ (MPa * $\sqrt{m}$) | | 0.79 | | | 0.82 | | |
| Vicker's hardness (kgf/mm²) | | | | | | | |
| Poisson's ratio | 0.222 | 0.222 | 0.221 | 0.228 | 0.233 | 0.234 | 0.226 |
| Shear modulus (GPa) | 32.6 | 34.3 | 35 | 37.6 | 35.4 | 36.4 | 34.5 |
| $E_{mod}$ (GPa) | 79.7 | 83.7 | 85.4 | 92.3 | 87.4 | 89.8 | 84.5 |
| $G_{1C}$ (J/m²) | | 7.46 | | | 7.69 | | |
| SOC (nm/MPa/cm) | 3.123 | 2.959 | 2.807 | 2.585 | 2.808 | 2.712 | 2.88 |
| Refractive index | 1.525 | | | 1.55 | 1.578 | | |
| Stored Strain Energy (J/m²) | | | | | | | |
| 100% NaNO₃, 2 h | 22 | | 35 | 35 | | | |
| 100% NaNO₃, 4 h | 45 | | 51 | 59 | | | |
| 100% NaNO₃, 16 h | 95 | | 105 | 86 | | | |
| 80% NaNO₃ / 20% KNO₃, 2 h | 23 | | 24 | 27 | | | |
| 80% NaNO₃ / 20% KNO₃, 4 h | 46 | | 43 | 43 | | | |
| 80% NaNO₃ / 20% KNO₃, 16 h | 86 | | 94 | 77 | | | |
| Maximum CT (MPa) | | | | | | | |
| 100% NaNO₃, 2 h | 61 | 108.3 | 81 | 70 | 119.9 | | |
| 100% NaNO₃, 3 h | | | | | | | |
| 100% NaNO₃, 4 h | 91 | 175.3 | 115 | 101 | 204.3 | | |
| 100% NaNO₃, 7 h | | | | | | | |
| 100% NaNO₃, 16 h | 175 | 147.2 | 211 | 176 | 172.2 | | |
| 80% NaNO₃ / 20% KNO₃, 2 h | 62 | | 52 | 54 | | | |
| 80% NaNO₃ / 20% KNO₃, 4 h | 93 | | 101 | 91 | | | |
| 80% NaNO₃ / 20% KNO₃, 16 h | 174 | | 181 | 169 | | | |

TABLE 2E

| Property | 29 | 30 | 31 | 32 | 33 | 34 | 35 |
|---|---|---|---|---|---|---|---|
| Strain (° C.) | 568 | 587 | 582 | 580 | 575 | | 617 |
| Liquidus temperature (° C.) | 1300 | | 1325 | | | | 1315 |
| Liquidus viscosity (P) | | | 683 | 3060 | 3060 | | 565 |
| $K_{1C}$ (MPa* $\sqrt{m}$) | | 0.81 | 0.83 | 0.87 | 0.8 | 0.84 | 0.82 |
| Vicker's hardness (kgf/mm²) | | 603 | | 632 | | 715 | |
| Poisson's ratio | 0.222 | 0.213 | 0.228 | 0.22 | 0.22 | 0.227 | 0.224 |
| Shear modulus (GPa) | 32.6 | 34 | 36.7 | 35.2 | 35.2 | 37.6 | 36.1 |
| $E_{mod}$ (GPa) | 79.8 | 82.4 | 90.3 | 85.8 | 85.9 | 92.3 | 88.3 |
| $G_{1C}$ (J/m²) | | 7.96 | 7.63 | 8.82 | 7.45 | 7.64 | 7.61 |
| SOC (nm/MPa/cm) | 3.082 | 2.988 | 2.724 | 2.87 | 2.87 | 2.62 | 2.769 |
| Refractive index | | 1.514 | 1.548 | 1.53 | | | 1.545 |
| Stored Strain Energy (J/m²) | | | | | | | |
| 100% NaNO₃, 2 h | | | | | | | |
| 100% NaNO₃, 4 h | | | | | | | |
| 100% NaNO₃, 16 h | | | | | | | |
| 80% NaNO₃ / 20% KNO₃, 2 h | | | | | | | |
| 80% NaNO₃ / 20% KNO₃, 4 h | | | | | | | |
| 80% NaNO₃ / 20% KNO₃, 16 h | | | | | | | |
| Maximum CT (MPa) | | | | | | | |
| 100% NaNO₃, 2 h | | 140.4 | | 114.381 | 125.71 | | |
| 100% NaNO₃, 3 h | | | 166.05 | | | | 166.95 |
| 100% NaNO₃, 4 h | | 188.4 | | 162.792 | 168.53 | | |
| 100% NaNO₃, 7 h | | | 213.65 | | | | |

TABLE 2E-continued

| Property | 29 | 30 | 31 | 32 | 33 | 34 | 35 |
|---|---|---|---|---|---|---|---|
| 100% NaNO$_3$, 16 h | | 116.4 | 168.84 | 144.275 | | 156.96 | 147.39 |
| 80% NaNO$_3$ / 20% KNO$_3$, 2 h | | | | | | | |
| 80% NaNO$_3$ / 20% KNO$_3$, 4 h | | | | | | | |
| 80% NaNO$_3$ / 20% KNO$_3$, 16 h | | | | | | | |

TABLE 2F

| Property | 36 | 37 | 38 | 39 | 40 | 41 |
|---|---|---|---|---|---|---|
| Strain (° C.) | | | | | 581 | 579 |
| Liquidus temperature (° C.) | | | | | 1305 | 1305 |
| Liquidus viscosity (P) | | | | | 1152 | 545 |
| K$_{1C}$ (MPa * √m) | 0.86 | 0.82 | 0.85 | 0.86 | 0.82 | 0.83 |
| Vicker's hardness (kgf/mm$^2$) | 717 | | 747 | 771 | | |
| Poisson's ratio | 0.235 | 0.219 | 0.237 | 0.242 | 0.22 | 0.226 |
| Shear modulus (GPa) | 38.7 | 36.1 | 40.3 | 42.5 | 35.2 | 36.3 |
| E$_{mod}$ (GPa) | 95.5 | 88.1 | 99.6 | 105.6 | 85.8 | 88.9 |
| G$_{1C}$ (J/m$^2$) | 7.74 | 7.63 | 7.25 | 7.00 | 7.84 | 7.75 |
| SOC (nm/MPa/cm) | 2.556 | 2.772 | 2.374 | 2.298 | 2.851 | 2.746 |
| Refractive index | | | | | 1.532 | 1.548 |
| Stored Strain Energy (J/m$^2$) | | | | | | |
| 100% NaNO$_3$, 2 h | | | | | | |
| 100% NaNO$_3$, 4 h | | | | | | |
| 100% NaNO$_3$, 16 h | | | | | | |
| 80% NaNO$_3$ / 20% KNO$_3$, 2 h | | | | | | |
| 80% NaNO$_3$ / 20% KNO$_3$, 4 h | | | | | | |
| 80% NaNO$_3$ / 20% KNO$_3$, 16 h | | | | | | |
| Maximum CT (MPa) | | | | | | |
| 100% NaNO$_3$, 2 h | 89.5 | 140.4 | 60.73 | 28.81 | | |
| 100% NaNO$_3$, 3 h | | | | | 162.93 | 132.68 |
| 100% NaNO$_3$, 4 h | 130.29 | 208 | 96.64 | 35.62 | | |
| 100% NaNO$_3$, 7 h | | | | | 245.66 | 196.66 |
| 100% NaNO$_3$, 16 h | 143.74 | 220.2 | 123.89 | 83.13 | 292.95 | 263.36 |
| 80% NaNO$_3$ / 20% KNO$_3$, 2 h | | | | | | |
| 80% NaNO$_3$ / 20% KNO$_3$, 4 h | | | | | | |
| 80% NaNO$_3$ / 20% KNO$_3$, 16 h | | | | | | |

The glass compositions, glass substrates, and glass articles shown in these examples have E$_{mod}$ values up to 106 GPa, hardness values up to 770 kgf/mm$^2$, fracture toughness values up to 0.866 MPa*√m, and strain points up to 750° C. The high strain points make it possible to ion-exchange glass substrates formed from the glass compositions at elevated temperatures (which speeds up diffusivity) with minimal stress relaxation.

When ion-exchanged, the resultant glass articles can achieve high levels of compressive stress (CS), central tension (CT), and deep depths of layer (DOL). For glass articles made from glass compositions containing both Li$^+$ and Na$^+$, CS values of greater than 500 MPa at up to 14 µm DOL and CT of up to 210 MPa were achieved in 100% KNO$_3$ baths at 430° C. for 7-16 hours. In glass articles made from glass compositions containing only Li$^+$, CT values of up to 210 MPa were measured after ion-exchange in a 100% KNO$_3$ bath at 430° C. for 16 hours. As is typical, mixed baths yielded lower CT values. As mentioned above, it is possible to ion-exchange the disclosed glass substrates at higher temperatures than the typical temperature range of from 430° C. to 450° C. for ion exchanged strengthenable glasses. The lower Y$_2$O$_3$ content in these glass compositions relative to previously described glasses successfully allows for the corresponding glass substrates to be ion-exchanged more efficiently. The resulting chemically strengthened glass articles exhibit high compressive stress and high central tension.

FIG. 2 shows SCALP profiles measured on 0.8 mm-thick coupons made from the glass composition of example 33, which was a remelt of the glass composition of example 32, that were ion-exchanged in a 2 wt % NaNO$_3$ bath. The glass composition exhibits liquidus and viscosity parameters appropriate for producing a rolled sheet. Under these ion exchange conditions, the glass articles can achieve central tension values of about 100 MPa with depth of compression (DOC) values of about 20% of thickness. Using the mixed bath ion exchange condition, a glass article made from the glass composition of example 33 yields surface compression values of over 900 MPa with a DOC greater than 5 µm.

FIGS. 3A-3D shows the fracture pattern for this glass article when ion exchanged under the conditions giving rise to the SCALP data shown in FIG. 2, as a consequence of impact with a tungsten carbide tip. The glass article shown in FIG. 3A was ion exchanged for 6 hours, the glass article shown in FIG. 3B was ion exchanged for 7 hours, the glass article shown in FIG. 3C was ion exchanged for 8 hours, and the glass article shown in FIG. 3D was ion exchanged for 9 hours. Because of the high Young's modulus of the glass composition forming the glass article, the coupons break into a few large parts despite the high CT, high CS, and large amount of stored strain energy.

FIGS. 4A-4D show the result of a series of ion exchange experiments providing the fragmentation pattern after impact with a tungsten carbide tip. The glass article shown in FIG. 4A was ion exchanged in a 2 wt % $NaNO_3$ bath, the glass article shown in FIG. 4B was ion exchanged in a 2.33 wt % $NaNO_3$ bath, the glass article shown in FIG. 4C was ion exchanged in a 2.66 wt % $NaNO_3$ bath, and the glass article shown in FIG. 4D was ion exchanged in a 3 wt % $NaNO_3$ bath. The cross-over point in terms of crack branching for this glass article (made from the glass composition of example 33) is between 27 $J/m^2$ and 31 $J/m^2$, demonstrating that the higher modulus allows for more energy to be stored.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass substrate formed from a glass composition comprising:
   from 60 mol. % to 75 mol. % $SiO_2$;
   from 2 mol. % to 15 mol. % $Li_2O$;
   from 1.9 mol. % to 15 mol. % $Y_2O_3$; and
   at least one of $B_2O_3$ and $Na_2O$;
   wherein:
   $B_2O_3+Na_2O$ is from 2 mol. % to 13 mol. %;
   $Y_2O_3+Al_2O_3$ is from 12.3 mol. % to 24 mol. %;
   a ratio $R_2O/Al_2O_3$ is from 0.5 to 4, where $R_2O$ is a total concentration of $Li_2O$, $Na_2O$, $K_2O$, $Rb_2O$, and $Cs_2O$;
   $R_2O$ is from 9 mol. % to 15 mol. %;
   $(R_2O+RO)/Al_2O_3$ is from 0.5 to 4.5, where RO is a total concentration of BeO, MgO, CaO, SrO, and BaO;
   the glass composition has a Young's modulus from 79.6 gigapascals (GPa) to 110 GPa; and
   the glass substrate is ion exchangeable to form a strengthened glass article.

2. The glass substrate of claim 1, wherein the glass substrate has a liquidus viscosity from 3 kilopoise (kP) to 50 kP.

3. The glass substrate of claim 1, wherein the glass substrate has a refractive index at 589.3 nm of from 1.5 to 1.6.

4. The glass substrate of claim 1, wherein the glass substrate has a fracture toughness of from 0.75 $MPa*\sqrt{m}$ to 0.9 $MPa*\sqrt{m}$.

5. The glass substrate of claim 1, wherein the glass substrate is strengthened by ion exchange in a 100% $NaNO_3$ bath at 430° C. for from 2 hours to 4 hours to form a strengthened glass article, and the glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension from 140 MPa to 210 MPa.

6. The glass substrate of claim 1, wherein the glass substrate is strengthened by ion exchange in a mixed bath comprising $NaNO_3$ and $KNO_3$ at 430° C. for from 2 to 16 hours to form a strengthened glass article, and the strengthened glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension from 90 MPa to 280 MPa.

7. The glass substrate of claim 6, wherein the mixed bath comprises from 75% to 85% $NaNO_3$ and from 15% to 25% $KNO_3$, and the tensile stress region has a maximum central tension from 150 MPa to 280 MPa.

8. The glass substrate of claim 1, wherein $0.8 \leq (R_2O+RO+Y_2O_3)/Al_2O_3 \leq 8$.

9. The glass substrate of claim 1, wherein $0.25 \leq Al_2O_3/Y_2O_3 \leq 9$.

10. The glass substrate of claim 1, wherein the glass composition comprises from 3.5 mol. % to 22 mol. % $Al_2O_3$.

11. The glass substrate of claim 1, wherein the glass composition comprises from 0 mol. % to 11 mol. % $B_2O_3$, and from 0 mol. % to 13 mol. % $Na_2O$.

12. The glass substrate of claim 11, wherein the glass composition comprises from 2 mol. % to 2.5 mol. % $Na_2O$.

13. The glass substrate of claim 1, wherein the glass composition comprises from 1.5 mol. % to 11 mol. % $B_2O_3$.

14. The glass substrate of claim 1, wherein the glass composition comprises 14.5 mol. % to 24 mol. % $Y_2O_3+Al_2O_3$ and the glass substrate has a fracture toughness from 0.8 $MPa*\sqrt{m}$ to 0.9 $MPa*\sqrt{m}$.

15. An electronic device comprising a cover element, the cover element comprising a glass substrate formed from a glass composition comprising:
   from 60 mol. % to 75 mol. % $SiO_2$;
   from 2 mol. % to 15 mol. % $Li_2O$;
   from 1.9 mol. % to 15 mol. % $Y_2O_3$; and
   at least one of $B_2O_3$ and $Na_2O$;
   wherein:
   $B_2O_3+Na_2O$ is from 2 mol. % to 13 mol. %;
   $Y_2O_3+Al_2O_3$ is from 12.3 mol. % to 24 mol. %;
   a ratio $R_2O/Al_2O_3$ is from 0.5 to 4, where $R_2O$ is a total concentration of $Li_2O$, $Na_2O$, $K_2O$, $Rb_2O$, and $Cs_2O$;
   $(R_2O+RO)/Al_2O_3$ is from 0.5 to 4.5, where RO is a total concentration of BeO, MgO, CaO, SrO, and BaO;
   $R_2O$ is from 9 mol. % to 15 mol. %;
   the glass substrate has a Young's modulus from 79.6 gigapascals (GPa) to 110 GPa; and
   the glass substrate is ion exchangeable to form a strengthened glass article.

16. The electronic device of claim 15, wherein the glass substrate has a liquidus viscosity from 3 kilopoise (kP) to 50 kP.

17. The electronic device of claim 15, wherein the glass substrate is strengthened by ion exchange in a 100% $NaNO_3$ bath at 430° C. for from 2 hours to 4 hours to form a strengthened glass article, and the strengthened glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension from 140 MPa to 210 MPa.

18. The electronic device of claim 17, wherein the glass substrate is strengthened by said ion exchange in the 100% $NaNO_3$ bath at 430° C. for from 3 to 4 hours to form a strengthened glass article, and the strengthened glass article comprises a compressive stress region extending from a first surface of the strengthened glass article to a depth of compression, and a tensile stress region extending from the depth of compression toward a second surface of the strengthened glass article opposite the first surface, the tensile stress region having a maximum central tension greater than or equal to 150 MPa.

19. The electronic device of claim 15, wherein the glass substrate has a refractive index at 589.3 nm of from 1.5 to 1.6.

20. The electronic device of claim 15, wherein the glass composition comprises 14.5 mol. % to 24 mol. % $Y_2O_3$+$Al_2O_3$ and the glass substrate has a fracture toughness from 0.8 MPa*$\sqrt{m}$ to 0.9 MPa*$\sqrt{m}$.

* * * * *